(12) United States Patent
Katsushima

(10) Patent No.: US 8,810,292 B2
(45) Date of Patent: Aug. 19, 2014

(54) PLL CIRCUIT

(71) Applicant: Renesas Electronics Corporation, Kawasaki (JP)

(72) Inventor: Akio Katsushima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/711,821

(22) Filed: Dec. 12, 2012

(65) Prior Publication Data

US 2013/0154697 A1    Jun. 20, 2013

(30) Foreign Application Priority Data

Dec. 15, 2011 (JP) .................................. 2011-274560

(51) Int. Cl.
*H03L 7/06* (2006.01)

(52) U.S. Cl.
USPC .......................................... 327/157; 327/148

(58) Field of Classification Search
USPC .................................................. 327/148, 157
See application file for complete search history.

(56) References Cited

U.S. PATENT DOCUMENTS

| | | | |
|---|---|---|---|
| 4,942,370 A | 7/1990 | Shigemori | |
| 7,239,188 B1* | 7/2007 | Xu et al. | 327/156 |
| 7,777,577 B2 | 8/2010 | Jennings et al. | |
| 8,289,057 B2* | 10/2012 | Kawamoto | 327/157 |
| 2003/0201816 A1* | 10/2003 | Dotson | 327/361 |
| 2003/0227332 A1* | 12/2003 | Lee et al. | 331/17 |
| 2005/0218998 A1* | 10/2005 | Lim | 331/16 |
| 2005/0248395 A1* | 11/2005 | Zhu et al. | 327/554 |
| 2005/0248413 A1* | 11/2005 | Zhu et al. | 331/17 |
| 2006/0244542 A1* | 11/2006 | Knoll et al. | 331/16 |
| 2008/0042759 A1* | 2/2008 | Watanabe | 331/17 |
| 2008/0203988 A1* | 8/2008 | Horikawa et al. | 323/282 |
| 2009/0160511 A1* | 6/2009 | Sudo | 327/157 |
| 2009/0160565 A1* | 6/2009 | Kawamoto | 331/1 A |
| 2010/0026406 A1* | 2/2010 | Fujiwara et al. | 331/36 R |
| 2010/0164596 A1* | 7/2010 | Olexenko | 327/361 |
| 2010/0208857 A1* | 8/2010 | Chen et al. | 375/376 |
| 2010/0271141 A1* | 10/2010 | Hirai | 331/34 |
| 2011/0063969 A1* | 3/2011 | Kawamoto | 369/126 |
| 2011/0215848 A1* | 9/2011 | Koroglu et al. | 327/157 |
| 2012/0051480 A1* | 3/2012 | Usugi et al. | 375/376 |
| 2013/0154697 A1* | 6/2013 | Katsushima | 327/157 |

FOREIGN PATENT DOCUMENTS

| | | | |
|---|---|---|---|
| JP | 58-107727 A | 6/1983 | |
| JP | 1-258510 A | 10/1989 | |

* cited by examiner

*Primary Examiner* — Adam Houston
(74) *Attorney, Agent, or Firm* — Sughrue Mion, PLLC

(57) ABSTRACT

A PLL circuit includes: a phase comparator for detecting a phase difference between a reference signal and a feedback signal; a first charge pump for outputting a current Ipr according to a detection result of the phase comparator; a second charge pump for outputting a current Iint according to the detection result of the phase comparator; a filter for outputting a current Iprop from which a high frequency component of the Ipr is removed; an integrator for integrating the Iint; a voltage-current conversion circuit for outputting a current Ivi according to an integrated result of the integrator; and an oscillator that generates an oscillating signal of a frequency according to a current Iro, a sum of the Iprop and the Ivi, and feeds it back to the phase comparator.

9 Claims, 33 Drawing Sheets

Related Art

PLL CIRCUIT

CROSS-REFERENCE TO RELATED APPLICATIONS

The disclosure of Japanese Patent Application No. 2011-274560 filed on Dec. 15, 2011 including the specification, drawings and abstract is incorporated herein by reference in its entirety.

BACKGROUND

The present invention relates to a PLL circuit, and more specifically, to a PLL circuit suitable especially for suppressing a long term jitter.

FIG. 23 is a diagram showing a configuration of a classic PLL circuit. A PLL circuit 500 shown in FIG. 23 has a phase comparator 501, a charge pump 502, a filter 503, a VCO 504, and a frequency divider 507. The VCO 504 has a voltage-current conversion circuit 505 and an oscillator 506. The filter 503 has a resistance element Rpr, a capacitative element Cint, and a capacitative element Cpr. The phase comparator 501 detects a phase difference between a reference signal Ref and an output signal (feedback signal) FB of the frequency divider 507. The charge pump 502 sends a current Icp according to a detection result of the phase comparator 501. The filter 503 suppresses an alternating current component of the current Icp, and outputs a signal (voltage). The VCO 504 outputs an oscillating signal of a frequency according to the signal (voltage) from the filter 503. Specifically, in the VCO 504, the voltage-current conversion circuit 505 outputs a current Iro according to a signal (voltage) from the filter 503. The oscillator 506 outputs the oscillating signal of a frequency according to the current Iro. The frequency divider 507 divides a frequency of the oscillating signal from the VCO 504 by N (N: a natural number), and outputs it as the feedback signal FB.

Here, a transfer function Kop of an open loop of the PLL circuit 500 shown in FIG. 23 is expressed by the following Formula (1).

$$Kop = \frac{Kcco \cdot Icp \cdot gm}{2\pi s^2 N \cdot Cint} \cdot \frac{1 + sCint \cdot Rpr}{1 + sCpr \cdot Rpr} \quad (1)$$

Incidentally, Kcco represents a gain [rad/A] of the oscillator 506. Icp represents an output current value of the charge pump 502. gm represents a transconductance [A/V] of the voltage-current conversion circuit 505. s represents a Laplacian operator. N represents a frequency division ratio of the frequency divider 507. Cint represents a capacitance value of the capacitative element Cint. Rpr represents a resistance value of the resistance element Rpr. Cpr represents the capacitance value of the capacitative element Cpr.

FIG. 24 is a diagram showing an open loop gain of the PLL circuit 500. A band, a zero point, and a high order frequency are expressed from Formula (1) by the following Formula (2), Formula (3), and Formula (4), respectively.

Frequency of band=$Icp \cdot Rpr \cdot gm \cdot Kcco/(2\pi N)$ (2)

Frequency of zero point=$1/(Rpr-Cint)$ (3)

High order frequency=$1/(Rpr-Cpr)$ (4)

A frequency of the reference signal Ref, an oscillating frequency of the VCO 504, and a frequency division ratio N of the frequency divider 507 are determined by the specification. Once the oscillating frequency of the VCO 504 is determined by the specification, a transconductance gm of the voltage-current conversion circuit 505 and a gain Kcco of the oscillator 506 are determined according to it. Moreover, once the frequency of the reference signal Ref is determined by the specification, a required band is also determined according to it. Therefore, adjustment of the band needs to be performed by changing a value of the output current Icp of the charge pump 502 and the resistance value of the resistance element Rpr.

On the other hand, in order to make the oscillating signal of the PLL circuit be locked stably, it is necessary to decrease a frequency of the zero point sufficiently smaller than a frequency of the band. Generally, the frequency of the zero point needs to be decreased to be, for example, about 2.5 times smaller than the frequency of the band. Thus, once the band is determined, the zero point is also determined according to it. Since the zero point needs to be a fixed value or less, a product of the resistance value of the resistance element Rpr and the capacitance value of the capacitative element Cint needs to be more than or equal to a fixed value. However, since the resistance element Rpr becomes a noise source, there arises a necessity of reducing it to be less than or equal to a fixed value based on the long term jitter determined by the specification. Therefore, the capacitance value of the capacitative element Cint needs to be a magnitude more than or equal to a fixed value.

In short, the classic PLL circuit 500 shown in FIG. 23 had a problem that was not able to suppress the long term jitter within a range of the specification, without increasing a circuit scale.

A solution over such a problem is disclosed by U.S. Pat. No. 7,777,577. FIG. 25 is a diagram showing a configuration of a PLL circuit 600 disclosed by U.S. Pat. No. 7,777,577. FIG. 26 is a diagram showing a configuration of a loop filter 604 provided in the PLL circuit 600 shown in FIG. 25. The PLL circuit 600 shown in FIG. 25 has a phase comparator 601, two charge pumps 602, 603, the loop filter 604, a voltage-controlled oscillator 605, and a frequency divider 606. The loop filter 604 has a gating circuit 607 and a filter 608, as shown in FIG. 26.

The gating circuit 607 is performing gating of an output current CPII of the charge pump 603 at a constant frequency. By changing the frequency of this gating, the amount of electric charges accumulated in a capacitative element 609 in the filter 608 is adjusted, and the frequency of the zero point is adjusted according to it. That is, in this PLL circuit 600, it is possible to adjust the frequency of the zero point only by changing a frequency of gating without increasing a capacitance value of the capacitative element 609. Therefore, for example, even when a resistance value of a resistance element 610 becomes small, it is possible to maintain the frequency of the zero point at a constant value by increasing the frequency of gating, without increasing the capacitance value of the capacitative element 609. That is, this PLL circuit 600 can suppress an output noise resulting from the resistance element 610 by making small a resistance value of the resistance element 610, without increasing the capacitance value of the capacitative element 609.

In addition to this, Japanese Unexamined Patent Publication No. S58 (1983)-107727 discloses a phase synchronizing circuit that has a voltage-controlled oscillator for generating an output signal of a frequency according to a control voltage, a first phase comparator for comparing an input signal and the output signal of the voltage-controlled oscillator, a low-pass filter for outputting a voltage according to a comparison result of the first phase comparator, a second phase comparator that compares the input signal and the output signal of the voltage-controlled oscillator and outputs a comparison result of a square wave characteristic, an integral circuit for integrating the comparison result of the second phase comparator, and an adder that adds the output of the low-pass filter and an output of the integral circuit and generates the control voltage (refer to FIG. 27).

Moreover, Japanese Unexamined Patent Publication No. Hei1 (1989)-258510 discloses a PLL circuit that has a phase comparator for detecting a phase difference between an input signal and an output clock signal, a proportional circuit for outputting a voltage V1 proportional to the phase difference detected by the phase comparator, an integral circuit for outputting a voltage V2 proportional to an integrated value of the phase difference detected by the phase comparator, and a voltage-controlled oscillator for generating the output clock of a frequency according to the voltages V1, V2 (refer to FIG. 28).

SUMMARY

In a PLL circuit 600 disclosed in U.S. Pat. No. 7,777,577, an amplifier 611 is provided between a resistance element 610 and a capacitive element 609 so that an output current CPPI of a charge pump 602 may not flow into the capacitive element 609 through the resistance element 610. Therefore, an output noise of the amplifier 611 will occur in this PLL circuit 600. Thereby, in this PLL circuit 600, even if the output noise resulting from a resistance value of the resistance element 610 was suppressed by making small the resistance value of the resistance element 610, there was a problem that the output noise could not be suppressed as the whole PLL circuit.

The PLL circuit according to the present invention has a phase comparator for detecting a phase difference between a reference signal and a feedback signal, first and second charge pumps each for outputting a current according to the detection result of the phase comparator, a filter for outputting a first current obtained by removing a high frequency component of the output current of the first charge pump, an integrator for integrating the output current of the second charge pump, a voltage-current conversion circuit for outputting a second current according to an integrated result of the integrator, and an oscillator that generates an oscillating signal of a frequency according to a third current generated by adding the first and the second currents and feeds it back to the phase comparator.

The circuit configuration as described above can suppress the output noise, without increasing a circuit scale. Thereby, it becomes possible, for example, to suppress a long term jitter within a range of the specification.

According to the present invention, it is possible to provide the PLL circuit capable of suppressing the output noise, without increasing the circuit scale. Thereby, it becomes possible, for example, to suppress the long term jitter within the range of the specification.

PREFERRED EMBODIMENTS

Hereinafter, embodiments of the present invention will be described referring to drawings. Incidentally, since the drawings are rather simplified, it must not interpret a technical scope of the present invention narrowly based on descriptions of these drawings. Moreover, the same symbol is given to the same constituent and an overlapping explanation is omitted.

In the following embodiments, although if there is a necessity for convenience, each of them will be divided into multiple sections or embodiments, it should be noted that they are not mutually unrelated except for the case where it is shown clearly specially, and there is a relationship that one is a modification, an application example, a detailed explanation, a supplementary explanation, etc. of a part of or the whole of the other. Moreover, in the following embodiments, when referring to the number of constituents etc. (including a number, a numerical value, a quantity, a range, etc.), the number is not limited to the specific number, but may be more than or less than the specific number, except for the case where it is clearly indicated in particular, the case where it is limited to a specific number theoretically, and other cases.

Furthermore, in the following embodiments, their constituents (including operation steps etc.) are not necessarily indispensable except for the cases where it is clearly indicated in particular, the case where it can be thought clearly indispensable fundamentally, and other cases. Similarly, in the following embodiments, when referring to a shape of a constituent etc., a spatial relationship, etc., it includes one that is virtually approximate or analogous to it in shape etc. except for the case where it is clearly indicated in particular, the case where it can be thought clearly not so fundamentally, and other cases. The same holds for the above-mentioned number etc. (including the number, the numerical value, the quantity, the range, etc.).

First Embodiment

Figure 1:
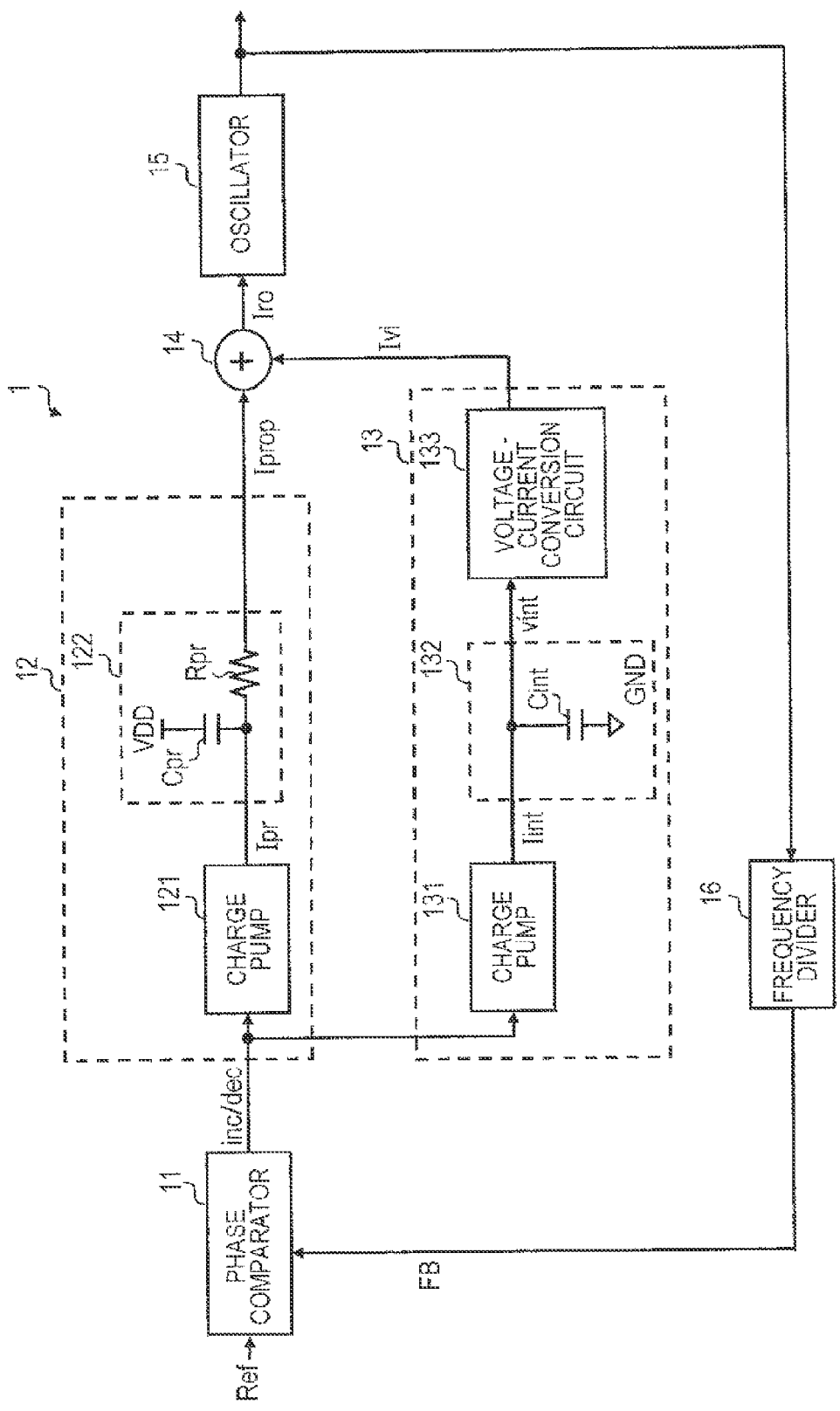
FIG. 1 is a diagram showing a configuration example of a PLL circuit according to a first embodiment of the present invention.

FIG. 1 is a diagram showing a configuration example of a PLL circuit 1 according to a first embodiment of the present invention. In the PLL circuit 1 according to this embodiment, a capacitative element Cint for integration and a resistance element Rpr forming a filter are provided over different paths, respectively. Therefore, a capacitance value of the capacitative element Cint and a resistance value of the resistance element Rpr are individually adjustable respectively, without being influenced mutually. Therefore, in the PLL circuit 1 according to this embodiment, it is possible to make small the resistance value of the resistance element Rpr, without enlarging the capacitance value of the capacitative element Cint. Thereby, the PLL circuit 1 according to this embodiment can suppress an output noise resulting from the resistance element Rpr, without increasing a circuit scale. As a result, the PLL circuit 1 according to this embodiment can control a long term jitter within a range of the specification, without increasing the circuit scale. Hereinafter, the PLL circuit 1 will be described specifically.

The PLL circuit 1 shown in FIG. 1 has a phase comparator 11, a proportional path 12, an integral path 13, an adder 14, an oscillator 15, and a frequency divider 16. A charge pump (first charge pump) 121 and a filter 122 are provided in the proportional path 12. A charge pump (second charge pump) 131, an integrator 132, and a voltage-current conversion circuit (hereinafter, called simply a VIC circuit) 133 are provided in the integral path 13.

(Phase Comparator 11)

The phase comparator 11 detects a phase difference between a reference signal Ref given from the outside of the PLL circuit 1 and a signal (more specifically, the output signal of the frequency divider 16) FB that was fed back from the oscillator 15. Then, the phase comparator 11 outputs the detected phase difference (detection result) to the two below-mentioned charge pumps as signals inc, dec, respectively.

(Proportional Path 12)

The proportional path 12 is a path through that outputs a current (first current) Iprop proportional to a detection result of the phase comparator 11.

In the proportional path 12, the charge pump 121 is a current-based charge pump, which outputs a current Ipr according to the detection result of the phase comparator 11. The filter 122 outputs the current Iprop obtained by removing a high frequency component of the output current Ipr of the charge pump 121. That is, the filter 122 is a low-pass filter for outputting the current Iprop that is the output current Ipr of the charge pump 121 from which the high frequency component is removed.

Specifically, the filter 122 has a capacitative element (first capacitative element) Cpr and the resistance element (second resistance element) Rpr. One end of the resistance element Rpr is coupled to an output terminal (node) of the charge pump 121; the other end of the resistance element Rpr is coupled to one input terminal (node) of the adder 14. One end of the capacitative element Cpr is coupled to one end of the resistance element Rpr; the other end of the capacitative element Cpr is coupled to a power supply voltage terminal (node) (reference voltage terminal (node)) VDD. Incidentally, the power supply voltage (reference voltage) VDD is supplied to the power supply voltage terminal (node) VDD from a first power supply. A signal wire between the output terminal (node) of the charge pump 121 and the one input terminal (node) of the adder 14 may be called a first signal line.

Here, the capacitative element Cint for integration is not provided in the proportional path 12. Therefore, the output current Ipr of the charge pump 121 is converted into the current Iprop through the filter 122, and subsequently is supplied to the adder 14 without being converted into a voltage. Therefore, the resistance value of the resistance element Rpr is individually adjustable without considering the capacitance value of the capacitative element Cint for integration.

(Integral Path 13)

The integral path 13 is a path that integrates a current according to the detection result of the phase comparator 11 and outputs a current (second current) Ivi according to the integrated result.

In the integral path 13, the charge pump 131 is a current-based charge pump, and outputs a current Iint according to the detection result of the phase comparator 11.

The integrator 132 integrates the output current Iint of the charge pump 131, and outputs an integrated result vint. An integrator 132 has a capacitative element (second capacitative element) Cint. One end of the capacitative element Cint is coupled to a node on a signal line (second signal line) that couples an output terminal (node) of the charge pump 131 and an input terminal (node) of the VIC circuit 133; the other end of the capacitative element Cint is coupled to a ground voltage terminal (node) GND. Incidentally, the ground voltage GND is supplied to the ground voltage terminal (node) GND from a second power supply.

In the integrator 132, the electric charges of the current Iint are accumulated in the capacitative element Cint, or the electric charges of the current Iint are discharged from the capacitative element Cint. Then, the voltage (integrated result) vint proportional to the electric charges accumulated in the capacitative element Cint is outputted.

The VIC circuit 133 converts the integrated result (voltage) vint of the integrator 132 into the current Ivi and outputs it. An output terminal (node) of the VIC circuit 133 is coupled to the other input terminal (node) of the adder 14.

In the integral path 13, it is possible to adjust a response speed of the current Ivi, for example, by changing the output current Iint of the charge pump 131, without enlarging the capacitance value of the capacitative element Cint.

(Adder 14)

The adder 14 adds the output current Iprop of the proportional path 12 and the output current Ivi of the integral path 13, and outputs a current (third current) Iro.

(Oscillator 15 and Frequency Divider 16)

The oscillator 15 outputs an oscillating signal of a frequency according to the output current Iro of the adder 14. For example, the oscillator 15 makes a frequency of the oscillating signal smaller as the current Iro becomes smaller; it makes the frequency of the oscillating signal larger as the current Iro becomes larger. The frequency divider 16 frequency-divides the oscillating signal outputted from the oscillator 15 by N (N is a natural number) and outputs it as the feedback signal FB.

Thus, in the PLL circuit 1 according to this embodiment, the capacitative element Cint for integration and the resistance element Rpr that forms a filter are provided over different paths. Therefore, the capacitance value of the capacitative element Cint and the resistance value of the resistance element Rpr are individually adjustable, respectively, without being influenced mutually. Therefore, in the PLL circuit 1 according to this embodiment, it is possible to make small the resistance value of the resistance element Rpr, without enlarging the capacitance value of the capacitative element Cint. Thereby, the PLL circuit 1 according to this embodiment can suppress the output noise resulting from the resistance element Rpr, without increasing the circuit scale. As a result, the PLL circuit 1 according to this embodiment can keep the long term jitter within the range of the specification, without increasing the circuit scale.

(Specific Configuration Example of Oscillator 15)

Figure 2:
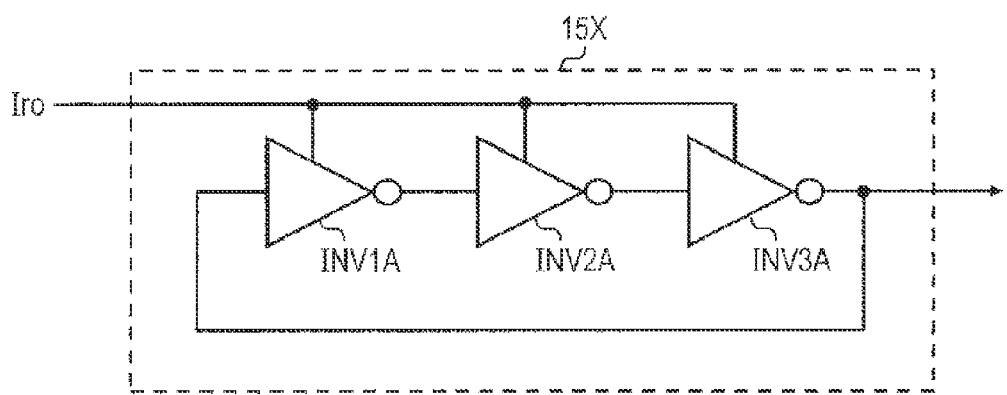
FIG. 2 is a diagram showing a specific configuration example of a ring oscillator.
Figure 3:
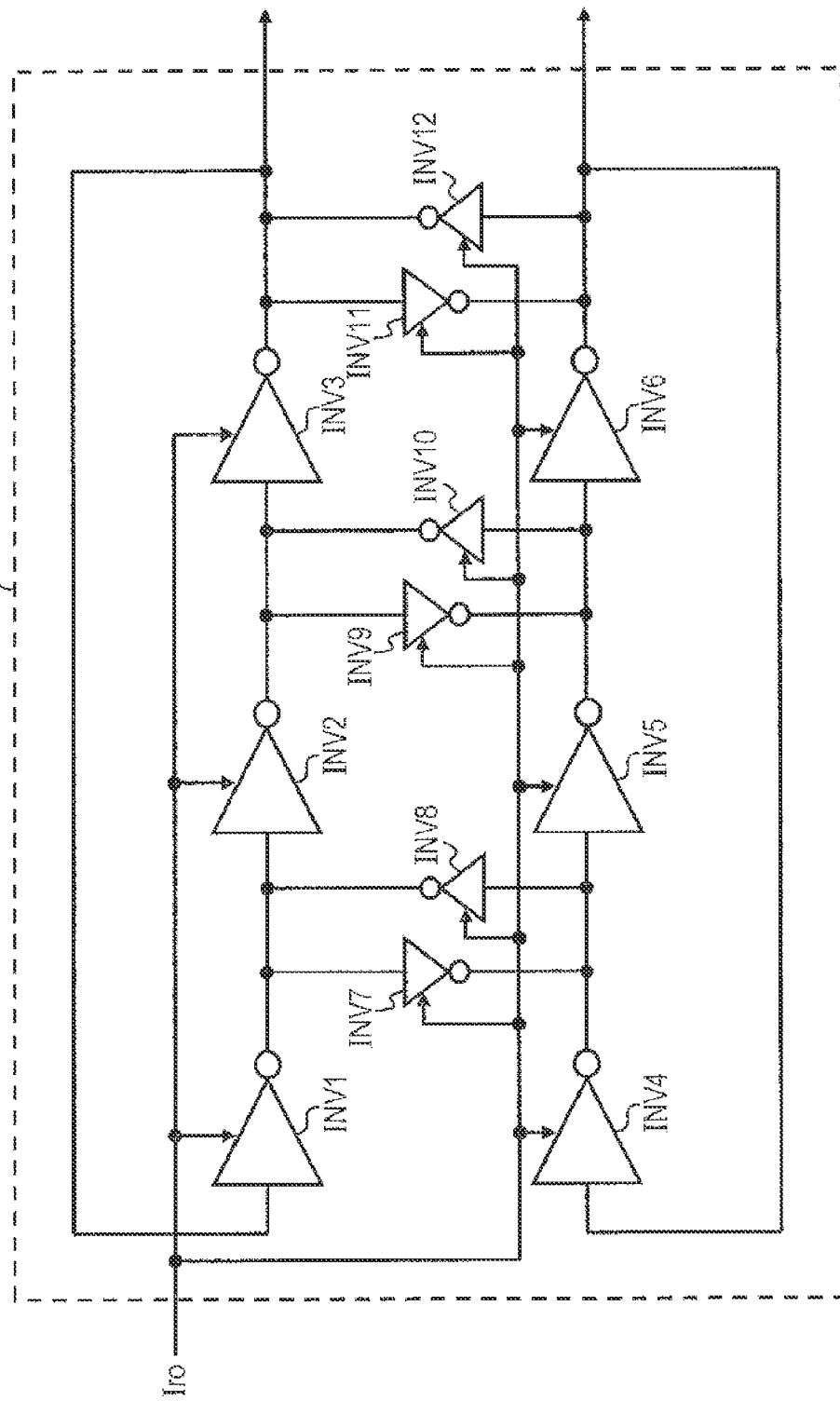
FIG. 3 is a diagram showing another specific configuration example of the ring oscillator.

Incidentally, the oscillator 15 is a ring oscillator, a multivibrator, etc., for example. FIG. 2 and FIG. 3 are diagrams showing specific configuration examples in the case where the oscillator 15 is a ring oscillator. Hereinafter, each configuration will be explained briefly.

The ring oscillator 15X shown in FIG. 2 has inverters INV1A to INV3A. These inverters INV1A to INV3A are coupled in series in a ring shape. The ring oscillator 15X is generating the oscillating signal of a frequency according to the current Iro by supplying the current Iro from the adder 14 to the inverters INV1A to INV3A as a drive current.

A ring oscillator 15Y shown in FIG. 3 has inverters INV1 to INV12. The inverters INV1 to INV3 are coupled in series in a ring shape. The inverters INV4 to INV6 are coupled in series in a ring shape independently from the inverters INV1 to INV3. The inverters INV7, INV8 are coupled in mutually different directions between an output terminal (node) of the inverter INV1 and an output terminal (node) of the inverter INV4. Incidentally, the inverters INV7, INV8 function as elements for harmonizing times at which respective output states of the inverters INV1, INV4 start to change. The inverters INV9, INV10 are coupled in mutually different directions between an output terminal (node) of the inverter INV2 and an output terminal (node) of the inverter INV5. Incidentally, the inverters INV9, INV10 function as elements for harmonizing times at which respective output states of the inverters INV2, INV5 start to change. The inverters INV11, INV12 are coupled in mutually different directions between an output terminal (node) of the inverter INV3 and an output terminal (node) of the inverter INV6. Incidentally, the inverters INV11, INV12 function as elements for harmonizing times at which respective output states of the inverters INV3, INV6 start to change.

The ring oscillator 15Y is generating the oscillating signal (differential signal) of a frequency according to the current Iro by supplying the current Iro from the adder 14 to the inverters INV1 to INV12 as a drive current. Incidentally, the ring oscillator 15Y shown in FIG. 3 can prevent the drive current Iro from fluctuating, because the number of the inverters whose outputs are in the H level becomes equal to the number of the inverters whose outputs are in the L level.

Incidentally, although in the examples of FIG. 2 and FIG. 3, the cases in each of which three inverters are coupled in series in a ring shape were explained as the examples, the ring oscillator is not limited to this but only an odd number of inverters need to be coupled in series.

Here, a PLL circuit of the related art and the PLL circuit 1 shown in this embodiment will be examined afresh. In the classic circuit described in FIG. 23, the resistance element Rpr is provided in a preceding stage of a voltage-current conversion circuit 505. A device noise voltage of the resistance element Rpr is expressed by $\sqrt{4kT \cdot Rpr}$, wherein k represents a Boltzmann's constant and T represents the absolute temperature. Therefore, the output noise resulting from the resistance element Rpr is expressed by the following Formula (5).

$$\text{Output noise} = \sqrt{4kT \cdot Rpr} \times gm \times Kcco \times HPF \quad (5)$$

Incidentally, HPF represents a transfer function to an output of a PLL circuit 500 from the resistance element Rpr.

Once a band is determined, HPF is determined according to it. Moreover, as described above, once the oscillating frequency of the VCO 504 is determined by the specification, a transconductance gm of the voltage-current conversion circuit 505 and a gain Kcco of the oscillator 506 are determined according to it.

Figure 23:
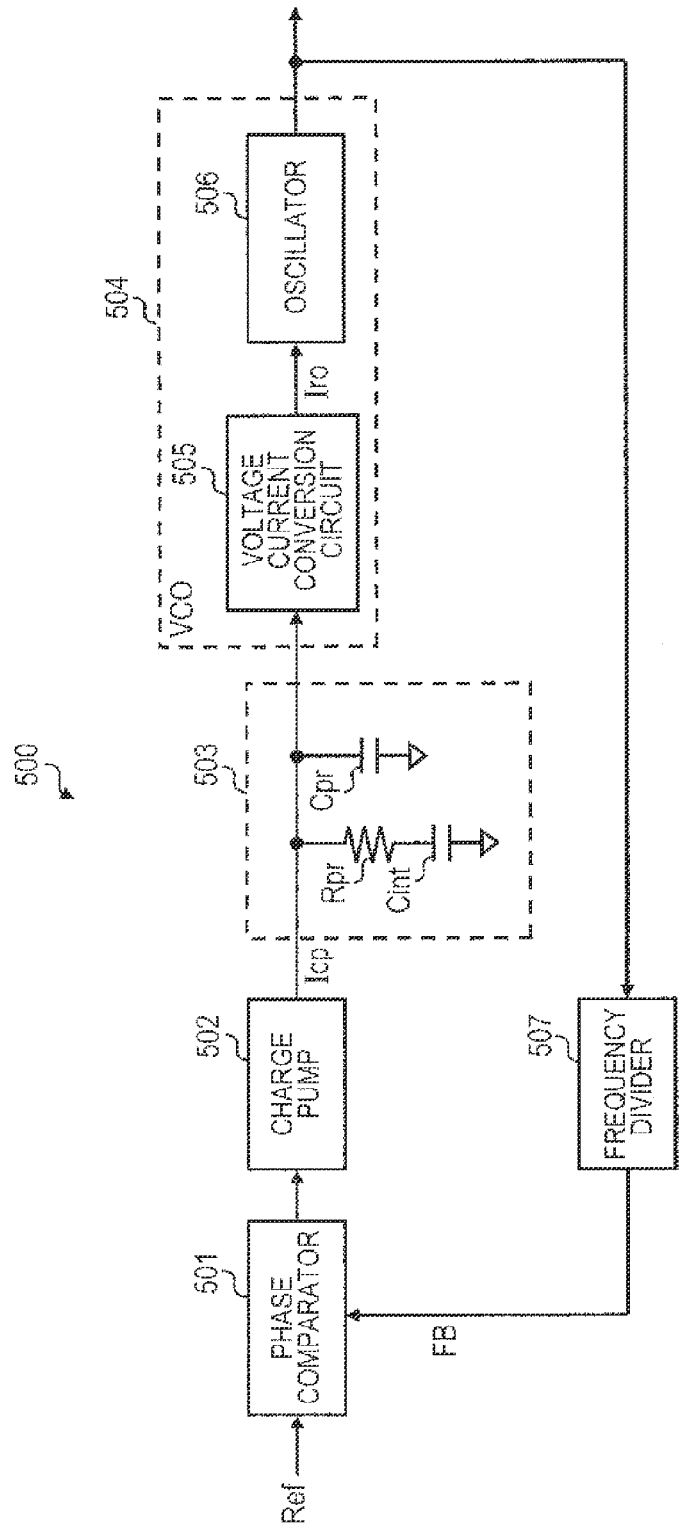
FIG. 23 is a diagram showing a configuration of a classic PLL circuit.
Figure 24:
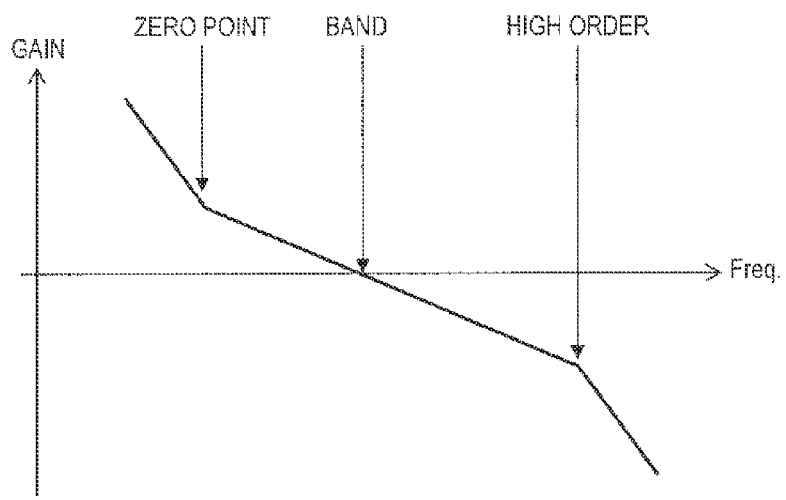
FIG. 24 is a diagram showing an open loop gain of the classic PLL circuit.

In recent years, since the oscillating frequency required for the VCO 504 in FIG. 23 has become large with acceleration of speed of the PLL circuit, the gain Kcco of the oscillator 506 is increasing. Moreover, since an operating voltage range of an analog circuit has become narrow in connection with voltage lowering of the PLL circuit, the transconductance gm of the voltage-current conversion circuit 505 tends to increase. Therefore, the output noise resulting from the resistance element Rpr is increasing steadily.

Figure 26:
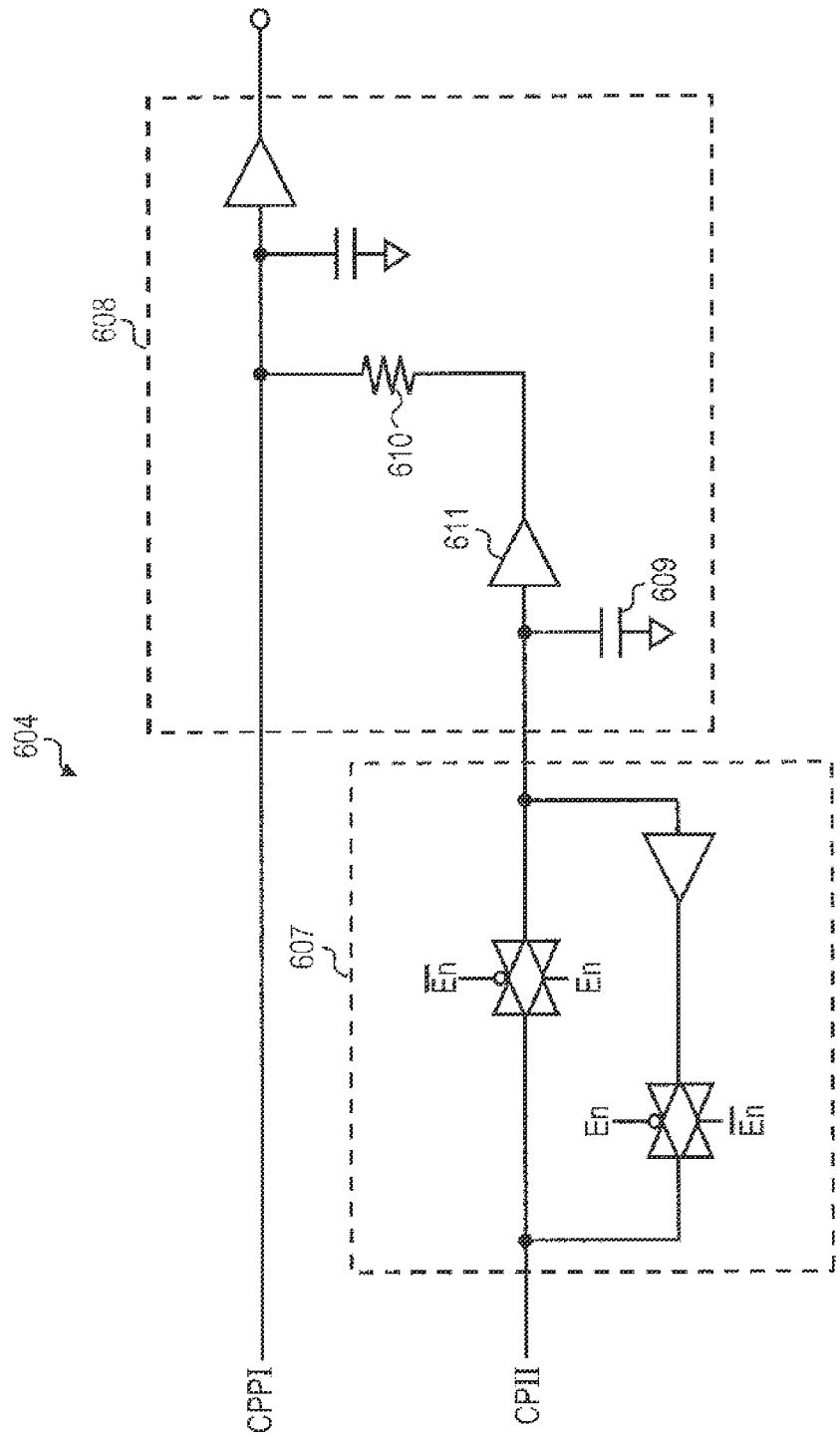
FIG. 26 is a diagram showing a configuration of a loop filter of the related art.

Also in the case of the configuration of U.S. Pat. No. 7,777,577 (FIG. 26), a resistance element 610 is provided, and further, an amplifier 611 is also provided. Since the resistance element 610 acts as a noise source, and further, the amplifier 611 also acts as a noise source, the output noise will increase like the classic PLL circuit shown in FIG. 23.

On the other hand, in the PLL circuit 1 shown in FIG. 1, since the resistance Rpr is not provided in the voltage-current conversion circuit 133 and there is no noise source, it becomes possible to improve the long term jitter. That is, it becomes possible for the PLL circuit 1 shown in this embodiment to reduce the long term jitter better than a PLL circuit 600 of U.S. Pat. No. 7,777,577, and it can suppress it within the range of the specification.

(Detailed Explanation of Output Noise)

Next, the output noise resulting from the resistance element Rpr of the PLL circuit 1 according to this embodiment will be explained in still more detail.

First, the output current Ivi of the integral path 13 is expressed by the following Formula (6).

$$Ivi = gm \times Iint/(sCint) \tag{6}$$

Incidentally, Ivi represents a current value of the output current Ivi of the integral path 13. gm represents a transconductance [A/V] of the VIC circuit 133. Iint represents an output current value of the charge pump 131. Cint represents the capacitance value of the capacitative element Cint. s represents a Laplacian operator.

Therefore, the output current Iro of the adder 14 is expressed by the following Formula (7).

$$Iro = Ivi + Iprop \tag{7}$$

$$= gm \times \frac{Iint}{sCint} + \frac{Ipr}{1 + sCpr \cdot Rpr}$$

Incidentally, Ipr represents an output current value of the charge pump 121. Cpr represents a capacitance value of the capacitative element Cpr. Rpr represents the resistance value of the resistance element Rpr.

From Formula (7), a transfer function Kop1 of an open loop of the PLL circuit 1 shown in FIG. 1 is expressed by the following Formula (8).

$$Kop\ 1 = \frac{Kcco \cdot Iint \cdot gm}{2\pi s^2 N \cdot Cint} \cdot \frac{1 + sCint \cdot A/gm}{1 + sCpr \cdot Rpr} \tag{8}$$

Incidentally, A is A=Ipr/Iint. Moreover, Kcco represents the gain [rad/A] of the oscillator 15. N represents a frequency division ratio of the frequency divider 16.

Figure 4:
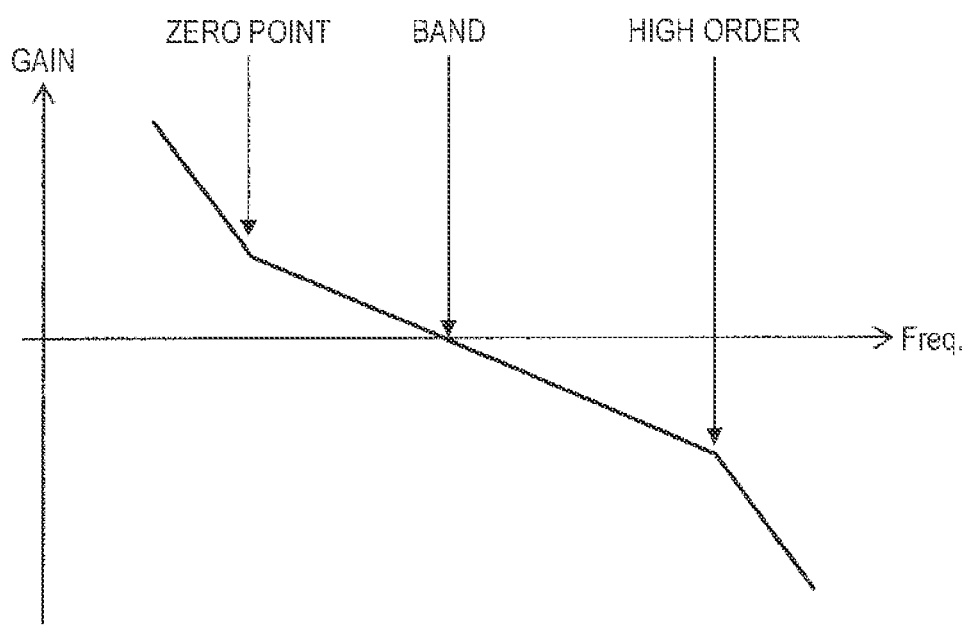
FIG. 4 is a diagram showing an open loop gain of the PLL circuit according to the first embodiment of the present invention.

FIG. 4 is a diagram showing an open loop gain of the PLL circuit 1 shown in FIG. 1. The band, a zero point, and a high order frequency are expressed by the following Formula (9), Formula (10), and Formula (11) from Formula (8), respectively.

$$\text{Frequency of band} = Ipr \cdot Kcco/(2\pi N) \tag{9}$$

$$\text{Frequency of zero point} = Iint \cdot gm/(Ipr \cdot Cint) \tag{10}$$

$$\text{High order frequency} = 1/(Rpr \cdot Cpr) \tag{11}$$

It is clear also from Formula (9) and Formula (10) that none of a frequency of the band and a frequency of the zero point is dependent on the resistance value of the resistance element Rpr. Therefore, by adjusting the output current Ipr of the charge pump 121, it is possible to adjust the band regardless of the resistance value of the resistance element Rpr.

On the other hand, it is possible to adjust the zero point by adjusting the output current Iint of the charge pump 131 and the capacitance value of the capacitative element Cint after the transconductance gm of the VIC circuit 133 and the output current Ipr of the charge pump 121 are determined. In other words, adjustment of the output current Iint of the charge pump 131 makes it possible to adjust frequency of the zero point without increasing the capacitance value of the capacitative element Cint. It is not necessary to take the resistance value of the resistance element Rpr into consideration at this time.

Here, the output noise resulting from the resistance element Rpr of the PLL circuit 1 shown in FIG. 1 is expressed by the following Formula (12).

$$\text{Output noise} = \sqrt{4kT \cdot Rpr} \times Kcco \times HPF1 \tag{12}$$

where k represents the Boltzmann's constant and T represents an absolute temperature. HPF1 represents a transfer function from the resistance element Rpr to an output of the PLL circuit 1.

From Formula (5) and Formula (12), comparing the output noise resulting from the resistance element Rpr of the PLL circuit 1 shown in FIG. 1 and the output noise resulting from the resistance element Rpr of the PLL circuit 500 shown in FIG. 23, a ratio of these output noises is expressed by the following Formula (13).

$$\frac{\sqrt{4kT/Rpr} \times Kcco \times HPF1}{\sqrt{4kT \cdot Rpr} \times gm \times Kcco \times HPF} \approx 1/(Rpr \cdot gm) \tag{13}$$

Here, the transfer function (HPF1, HPF) to an output of resistance noise is a band-pass filter with a band frequency of the PLL, and since when a band design is performed on the band-pass filter equivalently, an equivalent transfer function is obtained, Formula (13) can be derived.

Figure 25:
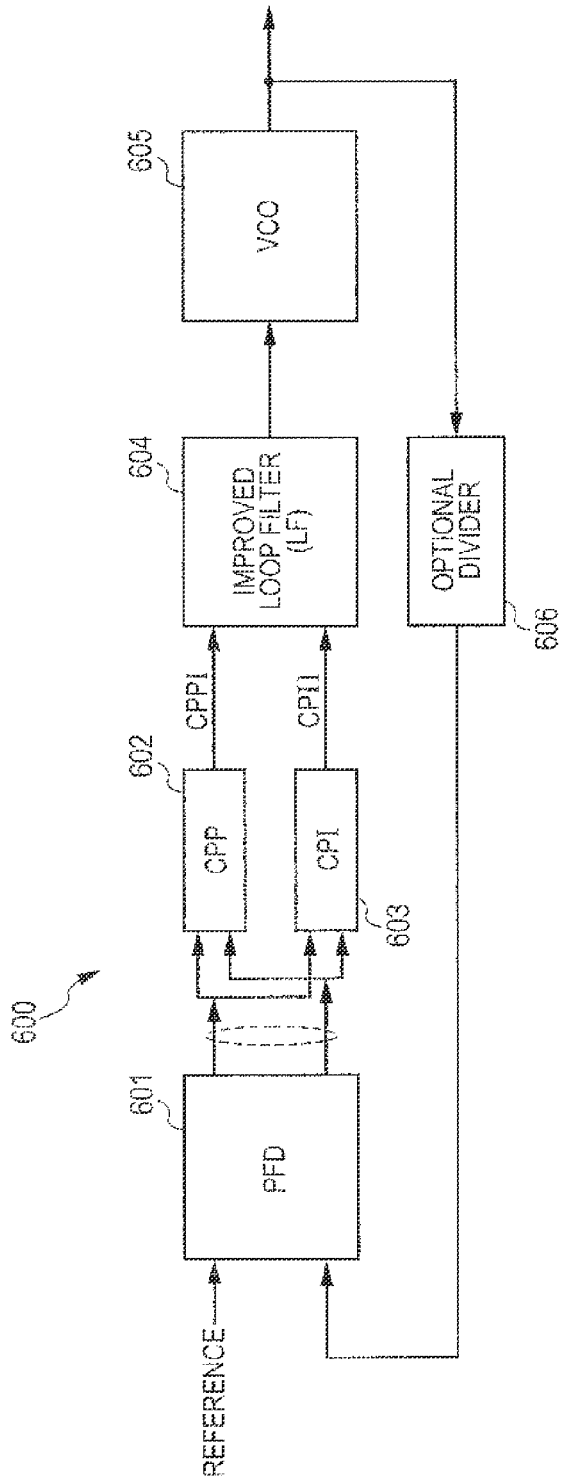
FIG. 25 is a diagram showing a configuration of the PLL circuit of the related art.

Normally, the resistance value of the resistance element Rpr is a few kΩ, and the transconductance gm of the VIC circuit 133 is a few mS. Therefore, Rpr and gm satisfy Rpr·gm>=10. Therefore, the output noise resulting from the resistance element Rpr of the PLL circuit 1 shown in FIG. 1 is suppressed by 10 times or more as compared with the related art. Moreover, since there is no necessity of providing an amplifier, unlike the PLL circuit 600 shown in FIG. 25, the output noise of the amplifier also does not arise.

Incidentally, the PLL circuit described in this specification is configured so that the proportional path may mainly adjust the phase difference between the feedback signal FB and the reference signal Ref, and the integral path may adjust a frequency of an output clock of the PLL circuit.

Second Embodiment

Figure 5:
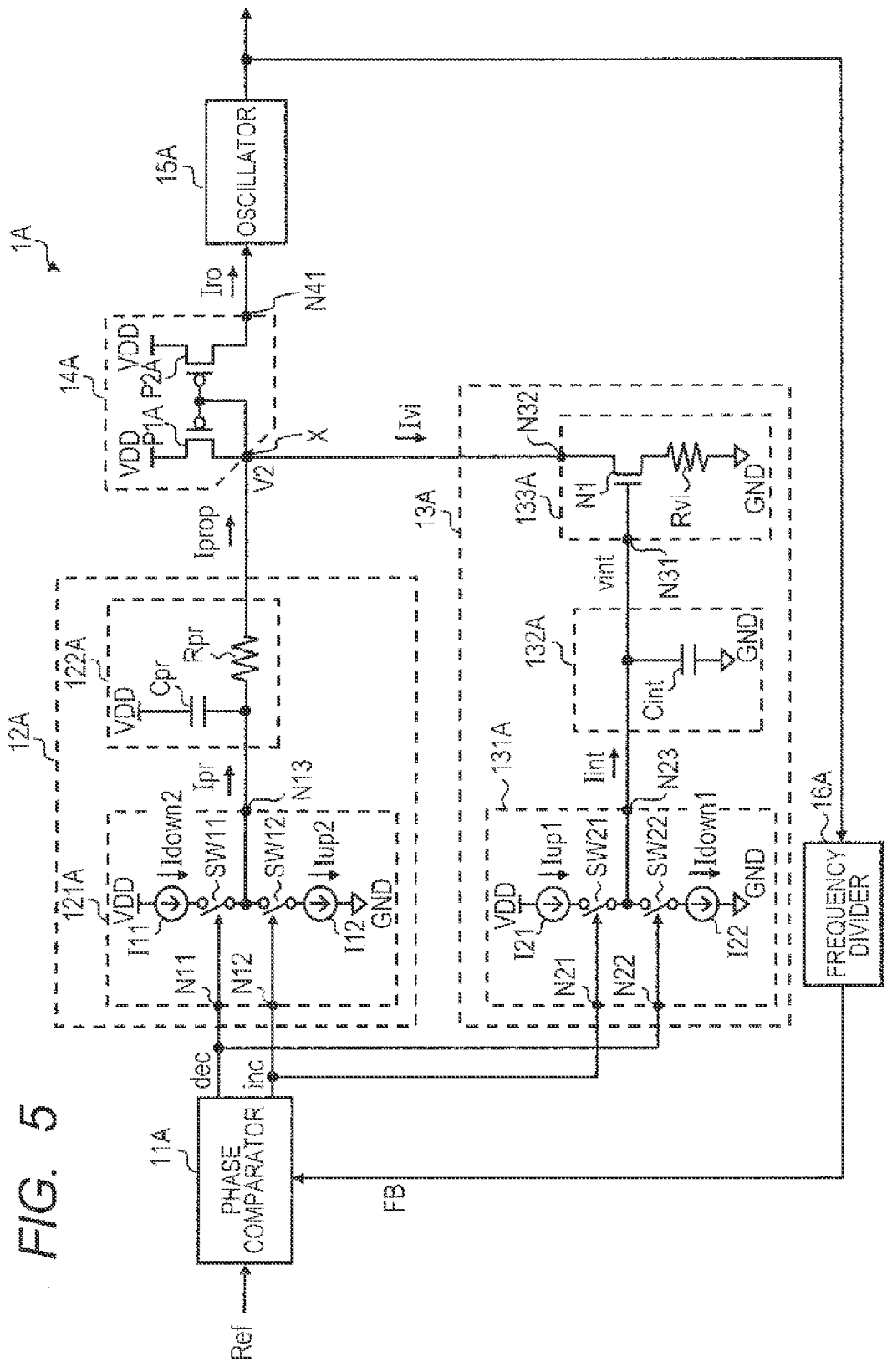
FIG. 5 is a diagram showing a configuration example of a PLL circuit according to a second embodiment of the present invention.

FIG. 5 is a diagram showing a configuration example of a PLL circuit 1A according to a second embodiment of the present invention. The PLL circuit 1A of FIG. 5 shows a specific configuration example of the PLL circuit 1 shown in FIG. 1.

The PLL circuit 1A has a phase comparator 11A, a proportional path 12A, an integral path 13A, an adder 14A, an oscillator 15A, and a frequency divider 16A. In the proportional path 12A, a charge pump (first charge pump) 121A and a filter 122A are provided. In the integral path 13A, a charge pump (second charge pump) 131A, an integrator 132A, and a VIC circuit 133A are provided.

The phase comparator 11A corresponds to the phase comparator 11 in FIG. 1. The proportional path 12A corresponds to the proportional path 12 in FIG. 1. The integral path 13A corresponds to the integral path 13 in FIG. 1. The adder 14A corresponds to the adder 14 in FIG. 1. The oscillator 15A corresponds to the oscillator 15 in FIG. 1. The frequency divider 16A corresponds to the frequency divider 16 in FIG. 1. The charge pump 121A corresponds to the charge pump 121 in FIG. 1. The filter 122A corresponds to the filter 122 in FIG. 1. The charge pump 131A corresponds to the charge pump 131 in FIG. 1. The integrator 132A corresponds to the integrator 132 in FIG. 1. The VIC circuit 133A corresponds to the VIC circuit 133 in FIG. 1.

(Phase Comparator 11A)

The phase comparator 11A detects a phase difference between the reference signal Ref and the feedback signal FB, and outputs signals dec, inc of a pulse width according to the phase difference. According to the pulse width of these signals dec, inc, an ON/OFF control of switching devices SW11, SW12, SW21, and SW22 that will be described later is performed.

Incidentally, it is also possible to make a design by which pulses of the signals dec, inc that turn on both the switching device SW11 and the switching device SW12 or turn on both the switching device SW21 and the switching device SW22 may have an overlap time during which a part of or the whole of one pulse overlaps the other pulse. However, in this embodiment, first, the case where a control without this overlap time is performed will be explained for simplification of explanation.

When a phase of the reference signal Ref is behind a phase of the feedback signal FB, the phase comparator 11A outputs the signal dec for turning off the switching device SW11 and the switching device SW22 that will be described later, and outputs the signal inc of a pulse width according to the phase difference that turns on the switching devices SW12 and SW21 for the pulse width duration that will be described later. On the other hand, when the phase of the feedback signal FB is ahead of the phase of the reference signal Ref, the phase comparator 11A outputs the signal inc for turning off the switching device SW12 and the switching device SW21, and outputs the signal dec of a pulse width according to the phase difference that turns on the switching devices SW11 and SW22 for the pulse width duration.

(Proportional Path 12A)

In the proportional path 12A, the charge pump 121A has constant current sources I11, I12 each for sending a constant current, and the switching devices SW11, SW12.

Here, it is common that each of the switching devices SW11, SW12 is formed with a P- or N-channel MOS transistor. Moreover, it is common that each of the constant current sources I11, I12 is formed, for example, with a P- or N-channel MOS transistor to whose gate the reference potential is impressed, respectively.

Moreover, in the case where the switching device SW11 can send a desired current with the signal dec from the above-mentioned phase comparator 11A (namely, in the case where the constant current source I11 can send the desired current), the switching device SW11 and the constant current source I11 may be formed with one MOS transistor. Similarly, in the case where the switching device SW12 can send a desired current with the signal inc from the above-mentioned phase comparator 11A (namely, in the case where the constant current source I12 can send the desired current), the switching device SW12 and the constant current source I12 may be formed with one MOS transistor.

When the constant current source I11, the switching device SW11, the switching device SW12, and the constant current source I12 are formed with four devices, the constant current source I11, the switching device SW11, the switching device SW12, and the constant current source I12 are coupled in series between the power supply voltage terminal (node) (reference voltage terminal (node)) VDD and the ground voltage terminal (node) GND. Incidentally, in the case where the switching device SW11 and the constant current source I11 are formed with one MOS transistor, and the switching device SW12 and the constant current source I12 are formed with one MOS transistor, these two MOS transistors are coupled in series between the power supply voltage terminal (node) VDD and the ground voltage terminal (node) GND.

Incidentally, in this embodiment, as shown in FIG. 5, the input node of the signal inc is designated as N11, and the input node and the output node of the signal dec are designated as N12 and N13, respectively, in the charge pump 121A.

Below, when the constant current source I11, the switching device SW11, the switching device SW12, and the constant current source I12 are formed with four devices, their specific configurations will be explained.

The constant current source I11 is placed between the power supply voltage terminal (node) VDD and a first terminal (node) of the switching device SW11. The switching device SW11 receives the signal dec from the phase comparator 11A at its control terminal (node). Then, conduction/non-conduction of the first terminal (node) and the second terminal (node) of the switching device SW11 is controlled by the signal dec.

The constant current source I12 is placed between the ground voltage terminal (node) GND and a first terminal (node) of the switching device SW12. The switching device SW12 receives the signal inc from the phase comparator 11A at its control terminal (node). Then, the conduction/non-conduction of the first terminal (node) and the second terminal (node) of the switching device SW12 are controlled by the signal inc.

A second terminal (node) of the switching device SW11 and a second terminal (node) of the switching device SW12 are coupled together, and this coupling node serves as the output node (N13) of the charge pump 121A.

Here, a current that the constant current source I12 sends at the time of ON of the switching device SW12 is designated as Iup2, a current that the constant current source I11 sends at the time of ON of the switching device SW11 is designated as Idown2, and a current that flows from an output of the charge pump 121A to the filter 122A mentioned later is designated as Ipr.

Ipr is a difference current of Iup2 and Idown2. The charge pump 121A outputs the current Ipr (=Idown2−Iup2) to the filter 122A.

For example, when the switching device SW11 turns on and the switching device SW12 turns off, the current Ipr equivalent to the current Idown2 flows toward the filter 122A from the constant current source I11 through the switching device SW11. On the other hand, when the switching device SW11 turns off and the switching device SW12 turns on, the current Ipr equivalent to the current Iup2 flows toward the constant current source I12 from the filter 122A side through the switching device SW12.

The filter 122A is of the same a configuration as that of the filter 122 shown in FIG. 1. That is, the filter 122A outputs the current Iprop that is the output current Ipr of the charge pump 121A from which the high frequency component is removed.

(Integral Path 13A)

In the integral path 13A, the charge pump 131A has constant current sources I21, I22 each for sending a fixed current and the switching devices SW21, SW22 like the charge pump 121A in the proportional path.

Here, it is common that each of the switching devices SW21, SW22 is comprised of a P- or N-channel MOS transistor. Moreover, it is common that each of the constant current sources I21, I22 is comprised of, for example, a P- or N-channel MOS transistor to whose gate a reference potential is impressed.

Moreover, in the case where the switching device SW21 can send a desired current by the signal inc from the above-mentioned phase comparator 11A (namely, when the constant current source I21 can send the desired current), the switching device SW21 and the constant current source I21 may be comprised of one MOS transistor. Similarly, in the case where the switching device SW22 can send a desired current by the signal dec from the above-mentioned phase comparator 11A (namely, when the constant current source I22 can send the desired current), the switching device SW22 and the constant current source I22 may be comprised of one MOS transistor.

In the case where the constant current source I21, the switching device SW21, the switching device SW22, and the constant current source I22 are formed with four devices, the constant current source I21, the switching device SW21, the switching device SW22, and the constant current source I22 are coupled in series between the power supply voltage terminal (node) (reference voltage terminal (node)) VDD and the ground voltage terminal (node) GND. Incidentally, in the case where the switching device SW21 and the constant current source I21 are formed with one MOS transistor and the switching device SW22 and the constant current source I22 are formed with one MOS transistor, these two MOS transistors are coupled in series between the power supply voltage terminal (node) VDD and the ground voltage terminal (node) GND.

Incidentally, in this embodiment, as shown in FIG. 5, the input node of the signal dec is designated as N22, and the input node and the output node of the signal inc are designated as N21 and as N23, respectively, in the charge pump 131A.

Below, when the constant current source I21, the switching device SW21, the switching device SW22, and the constant current source I22 are formed with four devices, their specific configurations will be explained.

The constant current source I21 is placed between the power supply voltage terminal (node) VDD and a first terminal (node) of the switching device SW21. The switching device SW21 receives the signal inc from the phase comparator 11A at its control terminal (node). Then, the conduction/non-conduction of the first terminal (node) and the second terminal (node) of the switching device SW21 is controlled by the signal inc.

The constant current source I22 is placed between the ground voltage terminal (node) GND and a first terminal (node) of the switching device SW22. The switching device SW22 receives the signal dec from the phase comparator 11A at its control terminal (node). Then, conduction/non-conduction of the first terminal (node) and the second terminal (node) of the switching device SW22 is controlled by the signal dec.

The second terminal (node) of the switching device SW21 and the second terminal (node) of the switching device SW22 are coupled together, and this coupling node serves as the output node (N23) of the charge pump 131A.

Here, a current that the constant current source I21 sends at the time of ON of the switching device SW21 is designated as Iup1, a current that the constant current source I22 sends at the time of ON of the switching device SW22 is designated as Idown1, and a current that flows from an output of the charge pump 131A to the integrator 132A mentioned later is designated as Iint.

Iint is a difference current of Iup1 and Idown1. The charge pump 131A outputs the above-mentioned current Iint (=Iup1−Idown1) to the integrator 132A.

For example, when the switching device SW21 turns on and the switching device SW22 turns off, the current Iint equivalent to the current Iup1 flows toward the integrator 132A from the constant current source I21 through the switching device SW21. On the other hand, when the switching device SW21 turns off and the switching device SW22 turns on, the current Iint equivalent to the current Idown1 flows toward the constant current source I22 from the integrator 132A side through the switching device SW22.

The integrator 132A is of the same configuration as that of the integrator 132 shown in FIG. 1. That is, the integrator 132A integrates the output current Iint of the charge pump 131A and outputs the integrated result vint.

The VIC circuit 133A has an N-channel MOS transistor (hereinafter, called simply a transistor) N1 and a resistance element (first resistance element) Rvi. The transistor N1 and the resistance element Rvi are coupled in series between a node (first node) X and the ground voltage terminal (node) GND. The transistor N1 is also called a fifth transistor.

Specifically, in the transistor N1, its drain is coupled to the node X, its source is coupled to one end of the resistance element Rvi, and its gate is supplied with the integrated result vint of the integrator 132A. The other end of the resistance element Rvi is coupled to the ground voltage terminal (node) GND.

Between a source and a drain of the transistor N1, a current Ivi according to the integrated result vint of the integrator 132A flows. For example, the larger the voltage level of the integrated result vint, the larger the current flowing between the source and the drain of the transistor N1 becomes; the smaller the voltage level of the integrated result vint, the smaller the current flowing between the source and the drain of the transistor N1 becomes. Incidentally, in this embodiment, an input node of the VIC circuit 133A is designated as N31, and an output node of the VIC circuit 133A is designated as N32.

In this configuration, the charge pump 121A in the proportional path 12A and the charge pump 131A in the integral path 13A are configured so that ON/OFF operations of the switching devices SW11, SW12 may become the same with the signal dec from the phase comparator 11A. Moreover, similarly, the charge pump 121A in the proportional path 12A and the charge pump 131A in the integral path 13A are configured so that ON/OFF operations of the switching devices SW11, SW12 may become the same with the signal inc from the phase comparator 11A.

As a result, this embodiment is configured so that when the signal dec is set up to send a current in a direction going to the output node (N13) of the charge pump 121A, the signal dec may be set up to draw a current in a direction going from the output node (N23) of the charge pump 131A. Similarly, this embodiment is configured so that when the signal inc is set up to draw a current in a direction going from the output node (N13) of the charge pump 121A, the signal inc may be set up to send a current in a direction going to the output node (N23) of the charge pump 131A. Then, finally, currents that are determined by operations of respective switching devices being set up by the signal dec and the signal inc, respectively, flow into respective output nodes (N13, N23).

(Adder 14A)

Transistors P1A, P2A that form the current-based adder 14A are current-mirror coupled. Specifically, in the transistor P1A, its source is coupled to the power supply voltage terminal (node) VDD, and its gate and drain are coupled to the node X. In the transistor P2A, its source is coupled to the power supply voltage terminal (node) VDD, its gate is coupled to the node X, and its drain is coupled to an input terminal (node) of the oscillator 25. Incidentally, the node X is also coupled to the other end of the resistance element Rpr and the drain of the transistor N1. Incidentally, the transistor P1A is also called a first transistor. The transistor P2A is also called a second transistor.

Between a source and a drain of the transistor P1A, a current that is a sum of an output current Iprop of the proportional path 12A and an output current Ivi of the integral path 13A flows. Between a source and a drain of the transistor P2A, a current Iro proportional to a current flowing between the source and the drain of the transistor P1A flows. Then, a drain current Iro of the transistor P2A is supplied to the oscillator 15A. Incidentally, in this embodiment, an input node of the adder 14A is designated as the node X, as described above, and an output node of the adder 14A is designated as N41.

(Oscillator 15A and Frequency Divider 16A)

The oscillator 15A outputs the oscillating signal of a frequency according to the current Iro as in the case of the oscillator 15 shown in FIG. 1. For example, the smaller the current Iro, the smaller the oscillator 15A makes a frequency of the oscillating signal; the larger the current Iro, the larger the oscillator 15A makes the frequency of the oscillating signal. Like in the case of the frequency divider 16A shown in FIG. 1, the frequency divider 16A frequency-divides the oscillating signal outputted from the oscillator 15A by N (N is a natural number) and outputs it as the feedback signal FB.

(Explanation of Detailed Operation of PLL Circuit 1A)

Next, an operation of the PLL circuit 1A shown in FIG. 5 will be explained in still more detail. First, an operation when the phase of the feedback signal FB is behind the phase of the reference signal Ref will be explained. In this case, the phase comparator 11A shall output the signal dec fixed to the L level, and shall output the signal inc of a pulse width according to the phase difference.

In the proportional path 12A, since the signal dec is fixed to the L level, the switching device SW11 turns off. On the other hand, the switching device SW12 turns on in a duration when the signal inc is in the H level of a pulse width according to the phase difference. Therefore, the current Ipr flows toward the constant current source I12 from the low-pass filter 122A side through the switching device SW12.

Although it becomes a repetition, here, in order to simplify the explanation, it is assumed that the phase comparator 11A outputs the signal dec fixed to the L level, and outputs the signal inc of a pulse width according to the phase difference. Therefore, the current Ipr=Idown2−Iup2=0−Iup2=−Iup2 flows. That is, the current of Iup2 will flow in a direction going from the filter 122A to the switching device SW12.

The filter 122A sends the current Iprop obtained by removing the high frequency component of the current Ipr. Here, the current Iprop flows toward the filter 122A side from the node X side.

Figure 6:
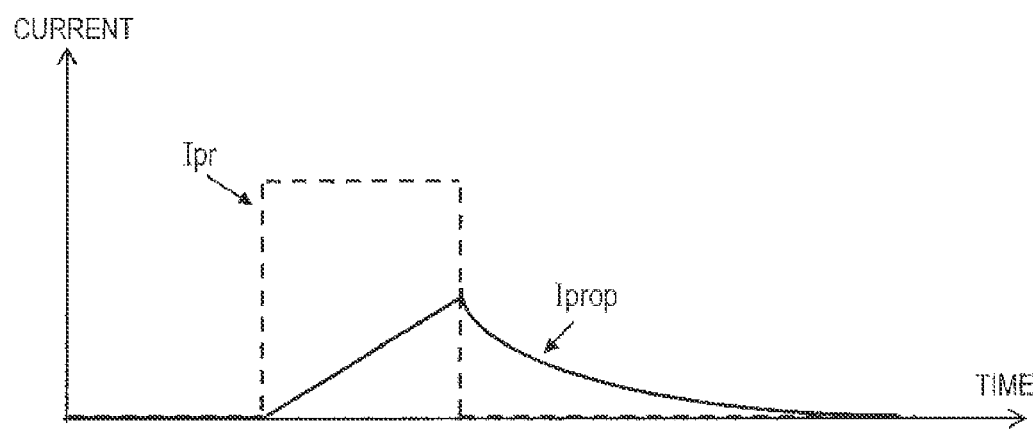
FIG. 6 is a diagram for explaining a part of an operation of the PLL circuit according to the second embodiment of the present invention.

FIG. 6 shows the current Ipr (dashed line) and the current Iprop (solid line). A current waveform of the current Ipr has a sufficiently quick response component as compared with the current Iprop. Therefore, the current Ipr shown by a dashed line is expressed by a shape of a square wave. On the other hand, the current Iprop shown by the solid line is expressed by a current waveform from which the high frequency component was removed. Incidentally, in FIG. 6, a vertical axis shows a current value (an arrow direction is a negative value), and a horizontal axis shows time.

In the integral path 13A, the signal inc turns on in a duration when the signal inc is in the H level of a pulse width according to the phase difference. On the other hand, since the signal dec is fixed to the L level, the switching device SW22 turns off. Consequently, the current Iint flows toward the integrator 132A side from the constant current source I21 through the switching device SW21.

Although it becomes a repetition, here, in order to simplify the explanation, it is assumed that the phase comparator 11A outputs the signal dec fixed to the L level, and outputs the signal inc of a pulse width according to the phase difference. Therefore, the current Iint=Iup1−Idown1=Iup1−0=Iup1 flows. That is, the current of Iup1 will flow in a direction going from the switching device SW21 to the integrator 132A.

In the integrator 132A, the electric charges of the current Iint are accumulated in the capacitative element Cint, and the voltage (integrated result) vint proportional to the electric charges is outputted. Since the voltage vint becomes large, in the VIC circuit 133A, the comparatively large current Ivi flows toward the ground voltage terminal (node) GND from the node X.

Thus, since the current Iprop flows toward the proportional path 12A side from the node X and the comparatively large current Ivi flows toward the integral path 13A side from the node X, the current flowing between the source and the drain of the transistor P1A of the adder 14A becomes comparatively large. In connection with it, the drain current Iro of the transistor P2A also becomes comparatively large. Thereby, the frequency of the oscillating signal outputted from the oscillator 15A becomes large. In connection with it, a frequency of the output signal (feedback signal) FB of the frequency divider 16A also becomes large. As a result, the phase of the feedback signal FB that was behind is advanced, and is adjusted so as to virtually coincide with the phase of the reference signal Ref.

Next, an operation when the phase of the feedback signal FB is ahead of the phase of the reference signal Ref will be explained. In this case, the phase comparator 11A outputs the signal dec of a pulse width according to the phase difference, and outputs the signal inc fixed to the L level.

In the proportional path 12A, the switching device SW11 turns on in a duration when the signal dec is in the H level of a pulse width according to the phase difference. On the other hand, since the signal inc is fixed to the L level, the switching device SW12 turns off. Consequently, the current Ipr flows toward the filter 122A side from the constant current source I11 through the switching device SW11.

Although it becomes a repetition, here, in order to simplify the explanation, it is assumed that the phase comparator 11A outputs the signal dec of a pulse width according to the phase difference, and outputs the signal inc fixed to the L level. Therefore, the current Ipr=Idown2−Iup2=Idown2−0=Idown2 flows. That is, the current of Idown2 will flow in a direction going from the switching device SW11 to the filter 122A.

The filter 122A sends the current Iprop obtained by removing the high frequency component of the current Ipr. Here, the current Iprop flows toward the node X side from the filter 122A side.

In the integral path 13A, since the signal inc is fixed to the L level, the switching device SW21 turns off. On the other hand, the switching device SW22 turns on in a duration when the signal dec is in the H level of a pulse width according to the phase difference. Consequently, the current Iint flows toward the constant current source I22 from the integrator 132A side through the switching device SW22.

Although it becomes a repetition, here, in order to simplify the explanation, it is assumed that the phase comparator 11A outputs the signal dec of a pulse width according to the phase difference, and outputs the signal inc fixed to the L level. Therefore, the current Iint=Iup1−Idown1=0−Idown1=−Idown1 flows. That is, the current of Idown1 will flow in a direction going from the integrator 132A to the switching device SW22.

In the integrator 132A, the electric charges of the current Iint are discharged from the capacitive element Cint. Then, the voltage (integrated result) vint proportional to the electric charges accumulated in the capacitive element Cint is outputted. Since the voltage vint becomes small, the comparatively small current Ivi flows toward the ground voltage terminal (node) GND from the node X in the VIC circuit 133A.

Thus, since the current Iprop flows toward the node X from the proportional path 12A side and the comparatively small current Ivi flows toward the integral path 13A side from the node X, the current flowing between the source and the drain of the transistor P1A of the adder 14A becomes comparatively small. In connection with it, the drain current Iro of the transistor P2A also becomes comparatively small. Thereby, the frequency of the oscillating signal outputted from the oscillator 15A becomes small. In connection with it, the frequency of the output signal (feedback signal) FB of the frequency divider 16A also becomes small. As a result, the phase of the advanced feedback signal FB is delayed, and is adjusted so as to virtually coincide with the phase of the reference signal Ref.

As explained above, the switching devices SW11, SW12 of the charge pump 121A were explained such that they did not have the overlap time during which both of them turned on from the phase comparator 11A for simplicity in the above (this also holds in the case of the charge pump 131A). However, even if the phase comparator 11A outputs the signals dec, inc so that the overlap time may be given, regarding the phase information, information is given as a width of the pulses of the signals dec, inc that turn on respective switching devices. That is, difference currents Ipr, Iint are given to the filter 122A and the integrator 132A in the proportional path 12A, respectively. Since these difference currents Ipr, Iint show the phase difference information surely, even if they have the overlap time, it is possible to make this circuit perform the same operation as described above, that is, it is possible for the phase comparator to output the currents inc, dec so that the switch elements may not have the overlap time during which the switch elements are turned on.

(Specific Configuration Example of Charge Pumps 121A, 131A)

FIG. 7A to FIG. 7F are diagrams showing specific configuration examples of the charge pump 121A. FIG. 8A to FIG. 8F are diagrams showing specific configuration examples of the charge pump 131A.

Each of FIG. 7A to FIG. 7C and FIG. 8A to FIG. 8C shows a specific example in the case where a signal level of the signals dec, inc outputted from the phase comparator 11A when turning on the switching devices SW11, SW12 or the switching devices SW21, SW22 is specified to be "H" and a signal level when turning off these switching devices is specified to be "L."

Figure 7A:
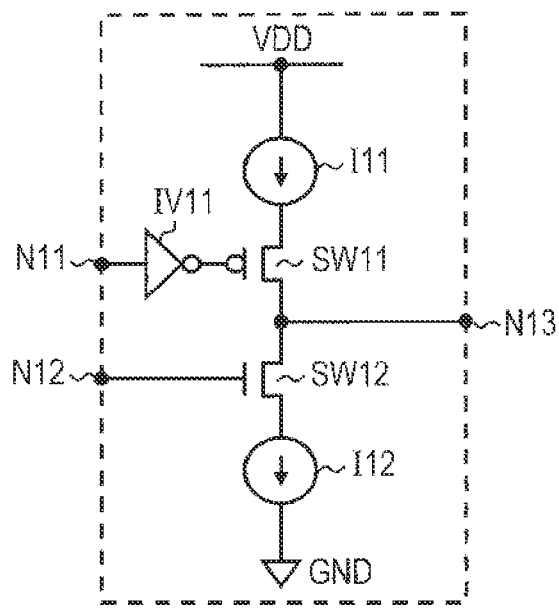
FIG. 7A is a diagram showing a specific configuration example of a charge pump 121A.

FIG. 7A is an example in which the switching device SW11 is comprised of a P-channel MOS transistor and the switching device SW12 is comprised of an N-channel MOS transistor.

In this case, since the switching device SW11 is the P-channel transistor, in order to turn on this P-channel MOS transistor, the signal dec impressed to the node N11 needs to be inverted. For this reason, the inverter IV11 is provided. Incidentally, although this inverter IV11 is described as an internal circuit of the charge pump for convenience, it may be provided at the output of the phase comparator 11A.

Figure 8A:
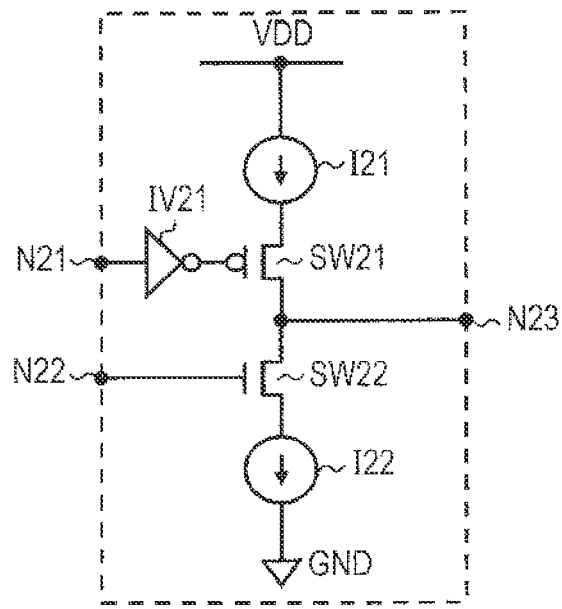
FIG. 8A is a diagram showing a specific configuration example of a charge pump 131A.

Similarly, FIG. 8A is an example in which the switching device SW21 is comprised of a P-channel MOS transistor and the switching device SW22 is comprised of an N-channel MOS transistor. Since the signal inc impressed to the node N21 needs to be inverted, an inverter IV21 is provided. Incidentally, although this inverter IV21 is described as an internal circuit of the charge pump for convenience, it may be provided at the output of the phase comparator 11A.

Figure 7B:
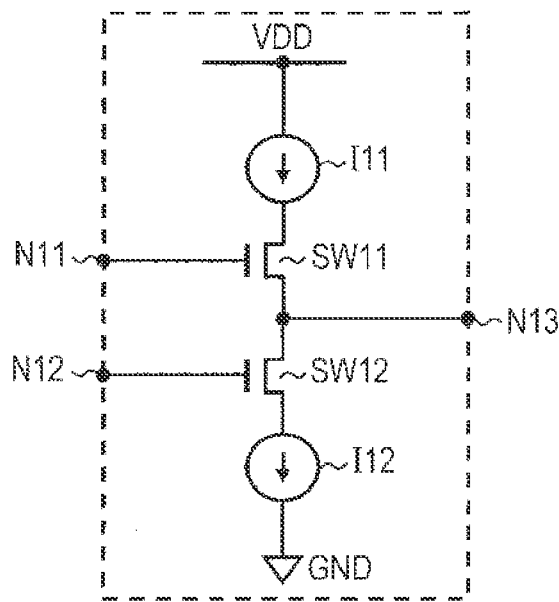
FIG. 7B is a diagram showing a specific configuration example of the charge pump 121A.

FIG. 7B is an example in which both of the switching devices SW11, SW12 are each comprised of an N-channel MOS transistor. In this case, since each of the switching devices SW11, SW12 is the N-channel MOS transistor, it is not necessary to invert the signals dec, inc impressed to the respective nodes N11, N12. For this reason, an additional circuit, such as an inverter, is unnecessary.

Figure 8B:
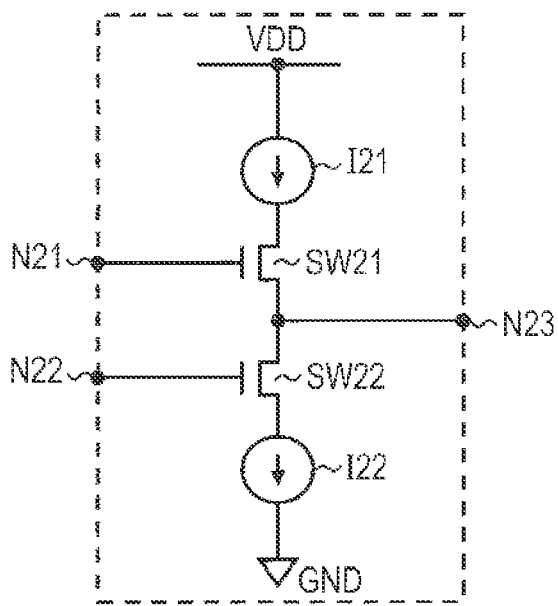
FIG. 8B is a diagram showing a specific configuration example of the charge pump 131A.

Similarly, FIG. 8B is an example in which both of the switching devices SW21, SW22 are each comprised of an N-channel MOS transistor. Since the signals dec, inc impressed to the respective nodes N21, N22 do not need to be inverted, an additional circuit, such as an inverter, is unnecessary.

Figure 7C:
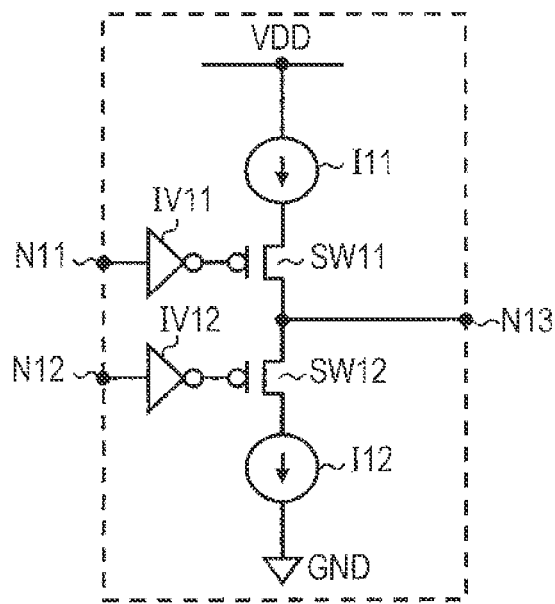
FIG. 7C is a diagram showing a specific configuration example of the charge pump 121A.
Figure 7D:
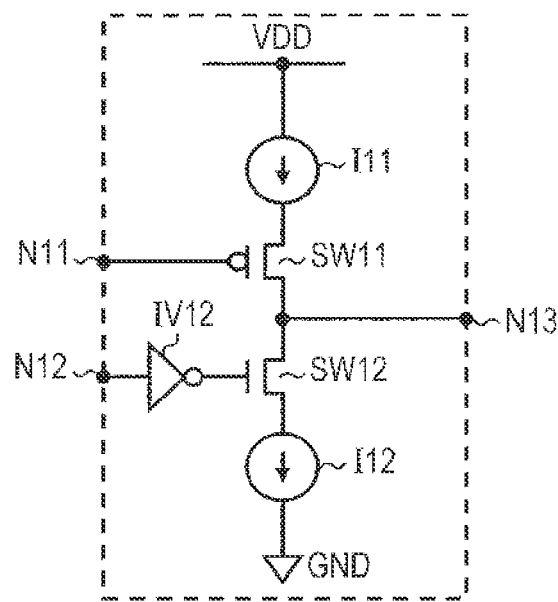
FIG. 7D is a diagram showing a specific configuration example of the charge pump 121A.
Figure 7E:
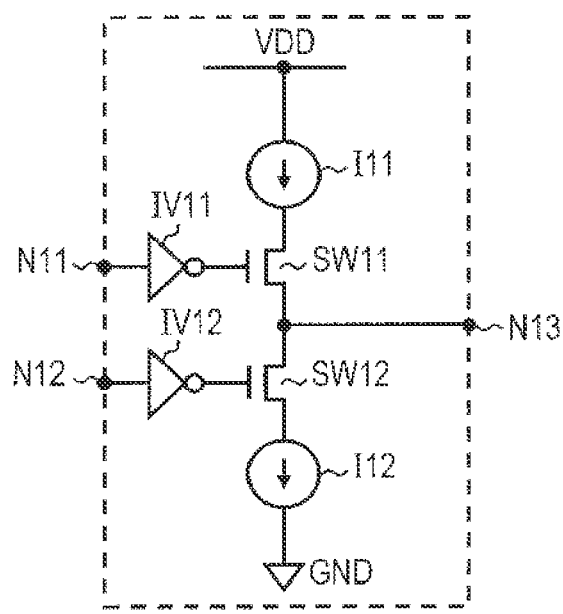
FIG. 7E is a diagram showing a specific configuration example of the charge pump 121A.
Figure 7F:
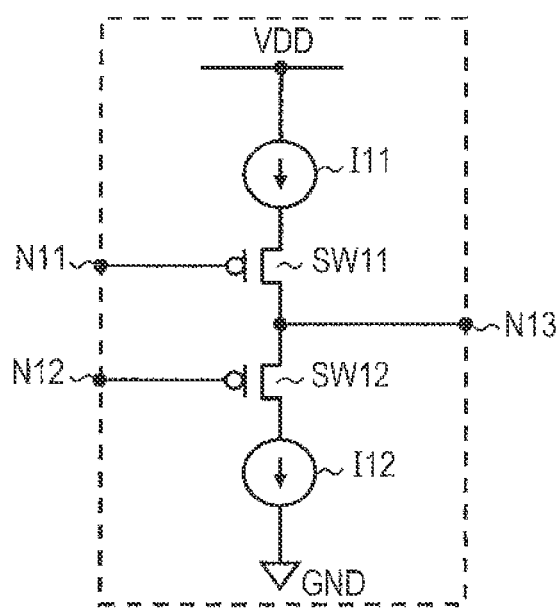
FIG. 7F is a diagram showing a specific configuration example of the charge pump 121A.

FIG. 7C is an example in which both of the switching devices SW11, SW12 are each comprised of a P-channel MOS transistor. In this case, the signals dec, inc impressed to the nodes N11, N12, respectively, need to be inverted. For this reason, the inverters IV11, IV12 are provided. Incidentally, although these inverters IV11, IV12 are described as internal circuits of the charge pump for convenience, they may be provided at an output of the phase comparator 11A.

Figure 8C:
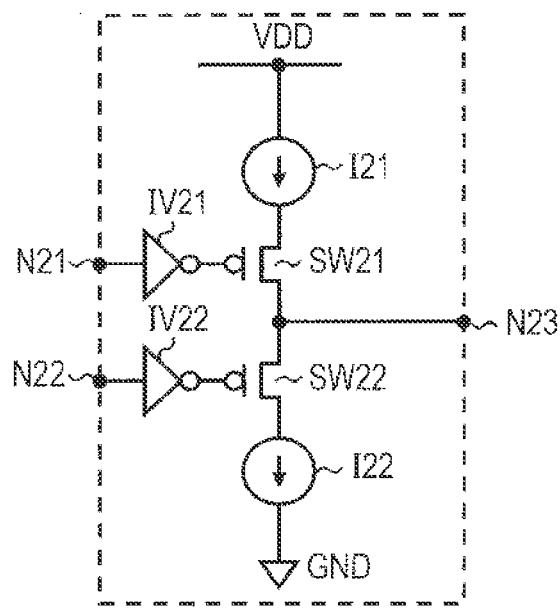
FIG. 8C is a diagram showing a specific configuration example of the charge pump 131A.
Figure 8D:
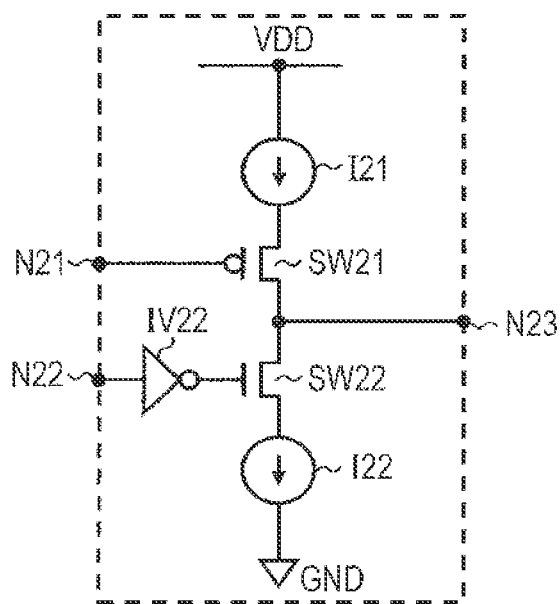
FIG. 8D is a diagram showing a specific configuration example of the charge pump 131A.
Figure 8E:
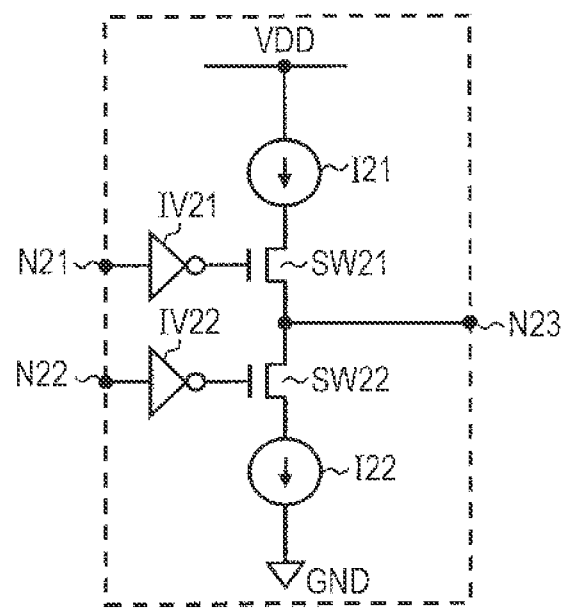
FIG. 8E is a diagram showing a specific configuration example of the charge pump 131A.
Figure 8F:
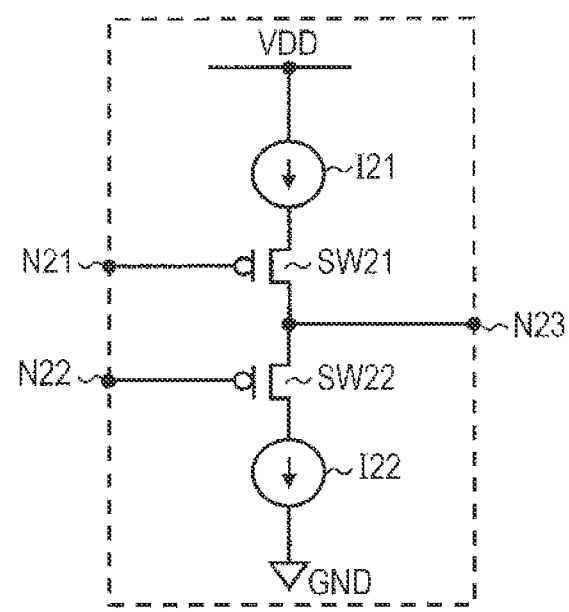
FIG. 8F is a diagram showing a specific configuration example of the charge pump 131A.

Similarly, FIG. 8C is an example in which both of the switching devices SW21, SW22 are each comprised of a P-channel MOS transistor. Since the signals dec, inc impressed to the nodes N21, N22, respectively, need to be inverted, the inverters IV21, IV22 are provided. Incidentally, although these inverters IV21, IV22 are described as internal circuits of the charge pump for convenience, they may be provided at the output of the phase comparator 11A.

FIG. 7D to FIG. 7F and FIG. 8D to FIG. 8F show specific examples in the case where a signal level of the signals dec, inc outputted from the phase comparator 11A when turning on the switching devices SW11, SW12 or SW21, SW22 is specified to be "L" and the level when turning them off is specified to be "H." The configurations of FIG. 7D to FIG. 7F and FIG. 8D to FIG. 8F are the configurations of FIG. 7A to FIG. 7C and FIG. 8A to FIG. 8C in each of which the polarity of the transistor used for the switching device is inverted by element substitution and an inverter is provided on a gate side of the P-channel MOS transistor. A specific explanation is omitted.

Incidentally, in an embodiment mentioned later, a pump of the same configuration shall be used for the charge pump 121A and the charge pump 131A in principle. Therefore, in the embodiment mentioned later, in the case where the configuration of FIG. 7A is adopted for the charge pump 121A, the configuration of FIG. 8A is adopted for the charge pump 131A. Similarly, in the case where the configurations of FIG. 7B to FIG. 7F are adopted for the charge pump 121A, the configurations of FIG. 8B to FIG. 8F are adopted for the charge pump 131A, respectively.

However, each of all the specific configuration examples of the above-mentioned charge pumps 121A, 131A is configured so that when the signal dec is set up to send a current in a direction going to the output node (N13) of the charge pump 121A, the signal dec may be set up to draw a current in a direction going from the output node (N23) of the charge pump 131A. Similarly, the each embodiment is configured so that when the signal inc is set up to draw a current in a direction going from the output node (N13) of the charge pump 121A, the signal inc may be set up to send a current in a direction going to the output node (N23) of the charge pump 131A. If the charge pump is configured in this way, charge pumps of the same configuration may not be necessarily used for the charge pump 121A and the charge pump 131A.

Figure 9A:
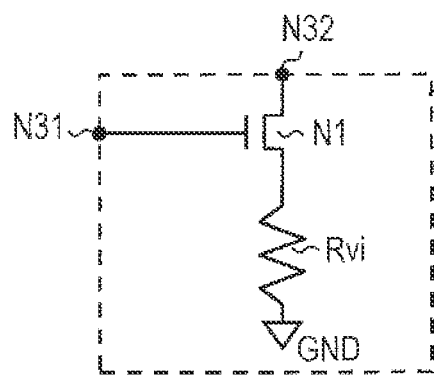
FIG. 9A is a diagram showing a specific configuration example of a VIC circuit 133A.
Figure 9B:
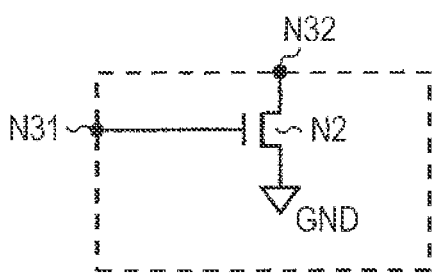
FIG. 9B is a diagram showing a specific configuration example of the VIC circuit 133A.

Moreover, it is also possible to replace the configuration (configuration shown in FIG. 9A) of the VIC circuit 133A with the configuration shown in FIG. 9B. The configuration shown in FIG. 9B has an N-channel MOS transistor (hereinafter, called simply a transistor) N2. In the transistor N2, its drain is coupled to the output node N32 (node X side), its source is coupled to the ground voltage terminal (node) GND, and its gate is coupled to the input node N31. Incidentally, the integrated result vint of the integrator 132A is supplied to the input node N31. Between a source and a drain of the transistor N2, the current Ivi according to the integrated result vint of the integrator 132A flows. The larger the voltage level of the integrated result vint, the larger the current flowing between the source and the drain of the transistor N2 becomes; the smaller the voltage level of the integrated result vint, the smaller the current flowing between the source and the drain of the transistor N2 becomes.

Figure 10A:
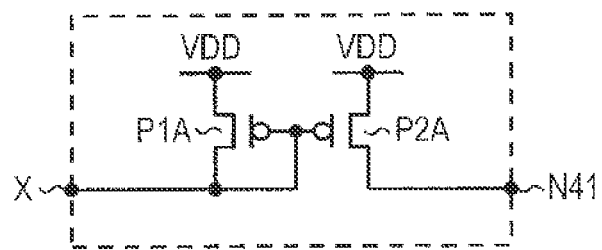
FIG. 10A is a diagram showing a specific configuration example of an adder 14A.
Figure 10B:
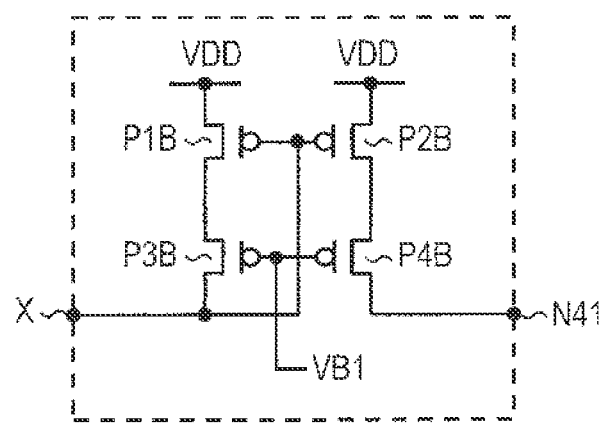
FIG. 10B is a diagram showing a specific configuration example of the adder 14A.
Figure 10C:
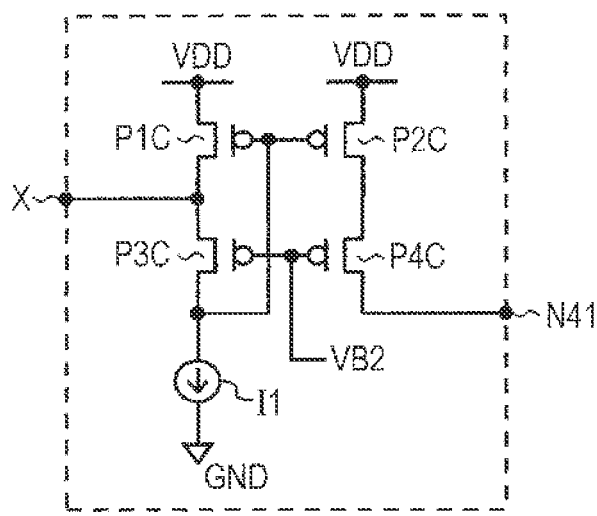
FIG. 10C is a diagram showing a specific configuration example of the adder 14A.

Moreover, it is also possible to replace the configuration (configuration shown in FIG. 10A) of the adder 14A with the configurations shown in FIG. 10B and FIG. 10C. Alternatively, the adder 14A may be of a configuration where the node X and the node N41 of FIG. 5 are simply short-circuited. Below, the configurations shown in FIG. 10B and FIG. 10C will be explained specifically.

The configuration shown in FIG. 10B has P-channel MOS transistors (hereinafter, called simply transistors) P1B to P4B. In the transistor P1B, its source is coupled to the power supply terminal (node) VDD, its drain is coupled to a source of the transistor P3B, and its gate is coupled to the node X. In the transistor P2B, its source is coupled to the power supply terminal (node) VDD, its drain is coupled to a source of the transistor P4B, and its gate is coupled to the node X. In the transistor P3B, its drain is coupled to the node X, and its gate is coupled to a gate of the transistor P4B. In the transistor P4B, its drain is coupled to the output node N41. That is, the transistor P3B is cascode-coupled to the transistor P1B. The transistor P4B is cascode-coupled to the transistor P2B. Incidentally, the transistors P1B to P4B are also called first to fourth transistors, respectively. Moreover, a bias voltage VB1 is impressed to respective gates of the transistors P3B, P4B.

A configuration shown in FIG. 10C has P-channel MOS transistors (hereinafter, called simply transistors) P1C to P4C and a constant current source I1. In the transistor P1C, its source is coupled to the power supply voltage terminal (node) VDD, its drain is coupled to the node X, and its gate is coupled to a drain of the transistor P3C. In the transistor P2C, its source is coupled to the power supply voltage terminal (node) VDD, its drain is coupled to a source of the transistor P4C, and its gate is coupled to the drain of the transistor P3C. In the transistor P3C, its source is coupled to the node X and its gate is coupled to a gate of the transistor P4C. In the transistor P4C, its drain is coupled to the output node N41. The constant current source I1 is provided between the drain of the transistor P3C and the ground voltage terminal (node) GND. Incidentally, the transistors P1C to P4C are also called first to fourth transistors, respectively. Moreover, a bias voltage VB2 is impressed to respective gates of the transistors P3C, P4C.

Figure 10D:
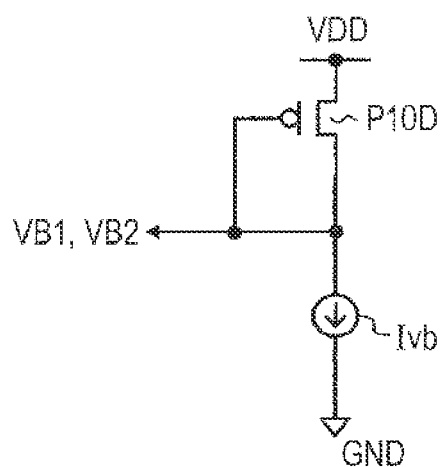
FIG. 10D is a diagram showing a configuration example of a bias voltage generating circuit.

Moreover, FIG. 10D is a diagram showing a configuration example of a bias voltage generating circuit for supplying the bias voltage VB1 (bias voltage VB2 to the configuration shown in FIG. 10C) to the configuration shown in FIG. 10B. The bias voltage generating circuit shown in FIG. 10D has one P-channel transistor (hereinafter, called simply a transistor) P10D and a current source Ivb. In the transistor P10D, its source is coupled to the power supply voltage terminal (node) VDD, and its gate and drain are coupled to the current source Ivb. The current source Ivb is provided between a gate and a drain of the transistor P10D and the ground voltage terminal (node) GND. Then, the bias voltage generating part shown in FIG. 10D outputs a voltage of the drain of the transistor P10D as the bias voltage VB1 (VB2).

Below, in a third embodiment to a sixth embodiment, further detailed configuration examples of the PLL circuit 1A shown in FIG. 5 will be shown. These detailed configuration examples are ones in which respective PLL circuits are formed by adopting some of the specific examples shown in FIG. 7A to FIG. 7F, FIG. 8A to FIG. 8F, FIG. 9A, FIG. 9B, FIG. 10A to FIG. 10C, etc.

Third Embodiment

Figure 11:
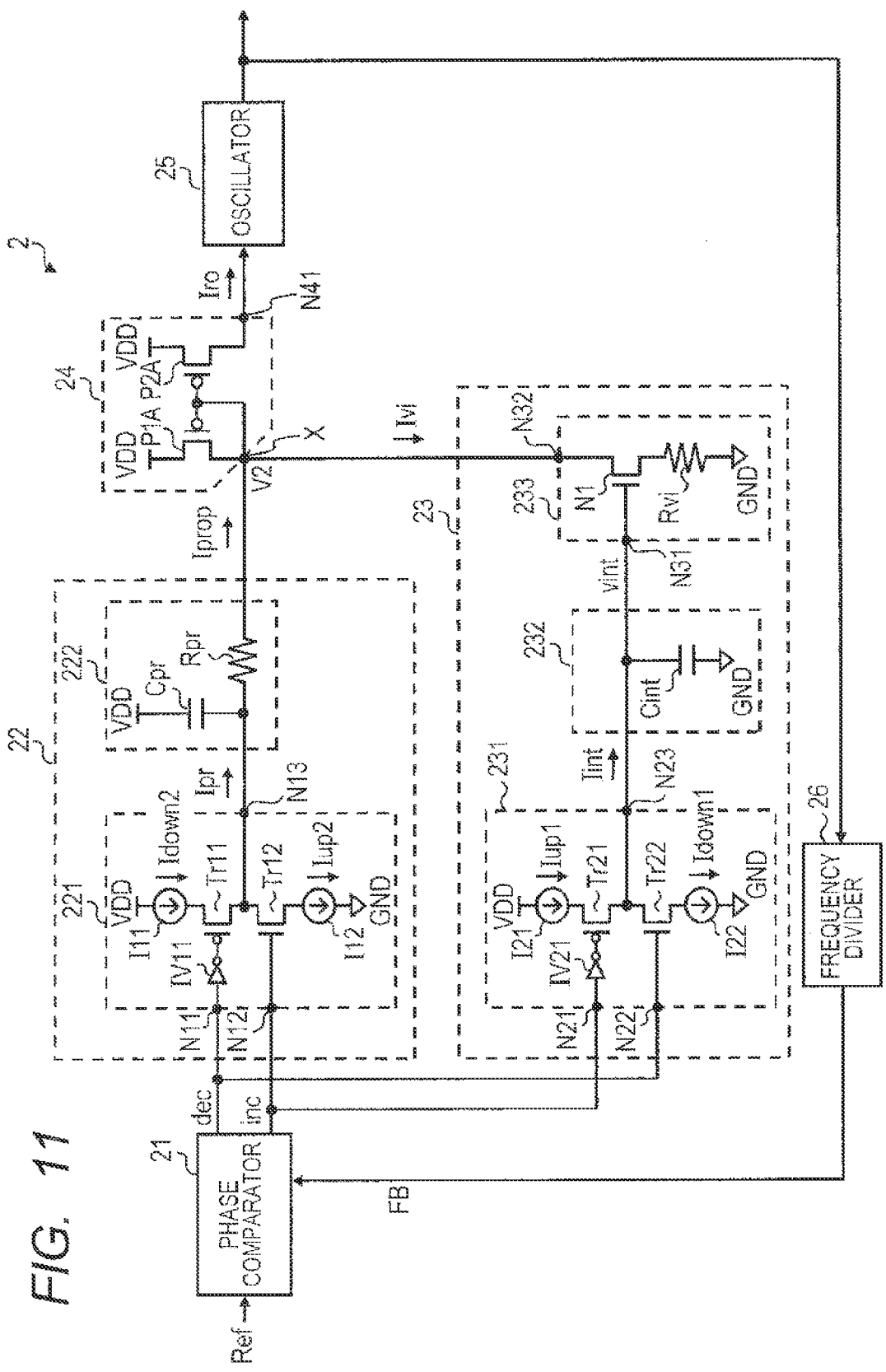
FIG. 11 is a diagram showing a configuration example of a PLL circuit according to a third embodiment of the present invention.

FIG. 11 is a diagram showing a configuration example of a PLL circuit 2 according to the third embodiment of the present invention. FIG. 11 shows a further detailed configuration example of the PLL circuit 1A shown in FIG. 5 as the PLL circuit 2.

The PLL circuit 2 shown in FIG. 11 has a phase comparator 21, a proportional path 22, an integral path 23, an adder 24, an oscillator 25, and a frequency divider 26. A charge pump (first charge pump) 221 and a filter 222 are provided in the proportional path 22. A charge pump (second charge pump) 231, an integrator 232, and a VIC circuit 233 are provided in the integral path 23. The adder 24 has the P-channel MOS transistors (hereinafter, called simply transistors) P1A, P2A.

The phase comparator 21 corresponds to the phase comparator 11 in FIG. 1. The proportional path 22 corresponds to the proportional path 12 in FIG. 1. The integral path 23 corresponds to the integral path 13 in FIG. 1. The adder 24 corresponds to the adder 14 in FIG. 1. The oscillator 25 corresponds to the oscillator 15 in FIG. 1. The frequency divider 26 corresponds to the frequency divider 16 in FIG. 1. The charge pump 221 corresponds to the charge pump 121 in FIG. 1. The filter 222 corresponds to the filter 122 in FIG. 1. The charge pump 231 corresponds to the charge pump 131 in FIG. 1. The integrator 232 corresponds to the integrator 132 in FIG. 1. The VIC circuit 233 corresponds to the VIC circuit 133 in FIG. 1.

The PLL circuit shown in FIG. 11 adopts the following circuits: a circuit shown in FIG. 7A as the charge pump circuit 221; a circuit shown in FIG. 8A as the charge pump circuit 231; a circuit shown in FIG. 9A as the VIC circuit 233; and a circuit shown in FIG. 10A as the adder 24. Therefore, transistors Tr11, Tr12, Tr21, and Tr22 all of which will be described later correspond to the switching device SW11, SW12, SW21, and SW22 shown in FIG. 7A and FIG. 8A, respectively.

(Phase Comparator 21)

The phase comparator 21 detects the phase difference between the reference signal Ref and the feedback signal FB, and outputs the signals dec, inc of a pulse width according to the phase difference. According to the pulse width of these signals dec, inc, an ON/OFF control of the transistors Tr11, Tr12, Tr21, and Tr22 mentioned later is performed.

Incidentally, a design that allows the transistor Tr21 and the transistor Tr22 to have the overlap time during which a part of or the whole of one pulse of the signals dec, inc overlaps the other pulse in such a way that both the transistor Tr11 and the transistor Tr12 turn on or both the transistor Tr21 and the transistor Tr22 turn on is also possible. However, in this embodiment, for simplification of explanation, the case where a control without this overlap time will be explained first.

When the phase of the feedback signal FB is behind the phase of the reference signal Ref, the phase comparator 21 outputs the signal dec that turns off the transistor Tr11 and the transistor Tr22 that will be described later, and outputs the signal inc of a pulse width according to the phase difference that turns on the transistor Tr12 and the transistor Tr21 for the pulse width duration that will be described later. On the other hand, when the phase of the feedback signal FB is ahead of the phase of the reference signal Ref, the phase comparator 21 outputs the signal inc that turns off the transistor Tr12 and the transistor Tr21, and outputs the signal dec of a pulse width according to the phase difference that turns on the transistor Tr11 and the transistor Tr22 for the pulse width duration.

In this embodiment, for example, when the phase of the feedback signal FB is behind the phase of the reference signal Ref, the phase comparator 21 outputs the signal dec fixed to the L level, and outputs the signal inc of a pulse width according to the phase difference. On the other hand, when the phase of the feedback signal FB is ahead of the phase of the reference signal Ref, the phase comparator 21 outputs the signal dec of a pulse width according to the phase difference and outputs the signal dec fixed to the L level.

(Proportional Path 22)

In the proportional path 22, the charge pump 221 has the constant current sources I11, I12 for sending fixed currents, the P-channel MOS transistor (hereinafter, called simply a transistor) Tr11 as a switching device, the N-channel MOS transistor (hereinafter, called simply a transistor) Tr12 as a switching device, and the inverter IV11 as a switching device. The constant current source I11, the transistor Tr11, the transistor Tr12, and the constant current source I12 are coupled in series between the power supply voltage terminal (node) (reference voltage terminal (node)) VDD and the ground voltage terminal (node) GND.

Specifically, in the constant current source I11, its input terminal (node) is coupled to the power supply voltage terminal (node) VDD and its output terminal (node) is coupled to a source of the transistor Tr11. In the transistor Tr11, its drain is coupled to a drain of the transistor Tr12 and its gate is supplied with an inverted signal of the signal dec. In the transistor Tr12, its source is coupled to an input terminal (node) of the constant current source I12 and its gate is supplied with the signal inc. In the constant current source I12, its output terminal (node) is coupled to the ground voltage terminal (node) GND. Then, the charge pump 221 outputs the current Ipr flowing into the node (node N13) between the drain of the transistor Tr11 and the drain of the transistor Tr12.

For example, when the transistor Tr11 turns on and the transistor Tr12 turns off, the current Ipr equivalent to the current Idown2 flows toward the filter 222 from the constant current source I11 through the transistor Tr11. On the other hand, when the transistor Tr11 turns off and the transistor Tr12 turns on, the current Ipr equivalent to the current Iup2 flows toward the constant current source I12 from the filter 222 side through the transistor Tr12.

The filter 222 is of the same configuration as that of the filter 122 shown in FIG. 1. That is, the filter 222 outputs the current Iprop obtained by removing the high frequency component of the output current Ipr of the charge pump 221.

(Integral Path 23)

In the integral path 23, like the charge pump 221 of the proportional path 22, the charge pump 231 has the constant current sources I21, I22 for sending fixed current, the P-channel MOS transistor (hereinafter, called simply a transistor) Tr21 as the switching device, the N-channel MOS transistor (hereinafter, called simply a transistor) Tr22 as the switching device, and the inverter IV21. The constant current source I21, the transistor Tr21, the transistor Tr22, and the constant current source I22 are coupled in series between the power supply voltage terminal (node) (reference voltage terminal (node)) VDD and the ground voltage terminal (node) GND.

Specifically, in the constant current source I21, its input terminal (node) is coupled to the power supply voltage terminal (node) VDD, and its output terminal (node) is coupled to a source of the transistor Tr21. In the transistor Tr21, its drain is coupled to a drain of the transistor Tr22 and its gate is supplied with an inversion signal of the signal inc. In the transistor Tr22, its source is coupled to an input terminal (node) of the constant current source I22, and its gate is supplied with the signal dec. In the constant current source I22, its output terminal (node) is coupled to the ground voltage terminal (node) GND. Then, the charge pump 231 outputs the current Iint that flows into the node (node N23) between a drain of the transistor Tr21 and the drain of the transistor Tr22.

For example, when the transistor Tr21 turns on and the transistor Tr22 turns off, the current Iint equivalent to the current Iup1 flows toward the integrator 232 from the constant current source I21 through the transistor Tr21. On the other hand, when the transistor Tr21 turns off and the transistor Tr22 turns on, the current Iint equivalent to the current Idown1 flows toward the constant current source I22 from the integrator 232 side through the transistor Tr22.

The integrator 232 is of the same configuration as that of the integrator 132 shown in FIG. 1. That is, the integrator 232 integrates the output current Iint of the charge pump 231, and outputs the integrated result vint.

The VIC circuit 233 has the N-channel MOS transistor (hereinafter, called simply a transistors) N1 and the resistance element (first resistance element) Rvi. The transistor N1 and the resistance element Rvi are coupled in series between the node (first node) X and the ground voltage terminal (node) GND. The transistor N1 is also called a fifth transistor.

Specifically, in the transistor N1, its drain is coupled to the node X, its source is coupled to the one end of the resistance element Rvi, and its gate is supplied with the integrated result vint of the integrator 232. The other end of the resistance element Rvi is coupled to the ground voltage terminal (node) GND.

Between the source and the drain of the transistor N1, the current Ivi according to the integrated result vint of the integrator 232 flows. For example, the larger the voltage level of the integrated result vint, the larger the current that flows between the source and the drain of the transistor N1 becomes; the smaller the voltage level of the integrated result vint, the smaller the current that flows between the source and the drain of the transistor N1 becomes.

(Adder 24)

The transistors P1A, P2A that form the current-based adder 24 are current-mirror-coupled. Specifically, in the transistor P1A, its source is coupled to the power supply voltage terminal (node) VDD, and its gate and drain are coupled to the node X. In the transistor P2A, its source is coupled to the power supply voltage terminal (node) VDD, its gate is coupled to the node X, and its drain is coupled to the input terminal (node) of the oscillator 25. Incidentally, the node X is also coupled to the other end of the resistance element Rpr and to the drain of the transistor N1.

Between the source and the drain of the transistor P1A, a current that is a sum of the output current Iprop of the proportional path 22 and the output current Ivi of the integral path 23 flows. Between the source and the drain of the transistor P2A, a current Iro proportional to the current that flows between the source and the drain of the transistor P1A flows. Then, the drain current Iro of the transistor P2A is supplied to the oscillator 25.

(Oscillator 25 and Frequency Divider 26)

The oscillator 25 outputs the oscillating signal of a frequency according to the current Iro, like in the case of the oscillator 15 shown in FIG. 1. For example, the oscillator 25 makes a frequency of the oscillating signal smaller as the current Iro becomes smaller, and it makes the frequency of the oscillating signal larger as the current Iro becomes larger. Like in the case of the frequency divider 16 shown in FIG. 1, the frequency divider 26 frequency-divides the oscillating signal outputted from the oscillator 25 by N (N is a natural number), and outputs it as the feedback signal FB.

(Detailed Explanation of Operation of PLL Circuit 2)

Next, an operation of the PLL circuit 2 shown in FIG. 11 will be explained in still more detail. First, an operation when the phase of the feedback signal FB is behind the phase of the reference signal Ref will be explained. In this case, the phase comparator 21 outputs the signal dec fixed to the L level, and outputs the signal inc of a pulse width according to the phase difference.

In the proportional path 22, since the signal dec is fixed to the L level, the transistor Tr11 turns off. On the other hand, the transistor Tr12 turns on in a duration when the signal inc is in the H level of a pulse width according to the phase difference. Consequently, the current Ipr flows toward the constant current source I12 from the filter 222 side through the transistor Tr12.

Incidentally, as described above, the phase comparator 21 is outputting the signal dec fixed to the L level, and is outputting the signal inc of a pulse width according to the phase difference. Therefore, the current Ipr=Idown2−Iup2=0−Iup2=−Iup2 flows. That is, the current of Iup2 will flow in a direction going from the filter 222 to the transistor Tr12.

The filter 222 sends the current Iprop obtained by removing the high frequency component of the current Ipr. Here, the current Iprop flows toward the filter 222 side from the node X side.

In the integral path 23, the transistor Tr21 turns on in a duration when the signal inc is in the H level of a pulse width according to the phase difference. On the other hand, since the signal dec is fixed to the L level, the transistor Tr22 turns off. Consequently, the current Iint flows toward the integrator 232 side from the constant current source I21 through the transistor Tr21.

Incidentally, as described above, the phase comparator 21 is outputting the signal dec fixed to the L level, and is outputting the signal inc of a pulse width according to the phase difference. Therefore, the current Iint=Iup1−Idown1=Iup1−0=Iup1 flows. That is, the current of Iup1 will flow in a direction going from the transistor Tr21 to the integrator 232.

In the integrator 232, the electric charges of the current Iint are accumulated in the capacitative element Cint, and the voltage (integrated result) vint proportional to the electric charges is outputted. Since the voltage vint becomes large, the comparatively large current Ivi flows toward the ground voltage terminal (node) GND from the node X in the VIC circuit 233.

Thus, since the current Iprop flows toward the proportional path 22 side from the node X and the comparatively large current Ivi flows toward the integral path side from the node X, a current that flows between the source and the drain of the transistor P1A of the adder 24 becomes comparatively large. In connection with it, the drain current Iro of the transistor P2A also becomes comparatively large. Thereby, the frequency of the oscillating signal outputted from the oscillator 25 becomes large. In connection with it, the frequency of the output signal (feedback signal) FB of the frequency divider 26 also becomes large. As a result, the phase of the feedback signal FB that was behind is advanced, and is adjusted so as to virtually coincide with the phase of the reference signal Ref.

Next, an operation when the phase of the feedback signal FB is ahead of the phase of the reference signal Ref will be explained. In this case, the phase comparator 21 outputs the signal dec of a pulse width according to the phase difference, and outputs the signal inc fixed to the L level.

In the proportional path 22, the transistor Tr11 turns on in a duration when the signal dec is in the H level of a pulse width according to the phase difference. On the other hand, since the signal inc is fixed to the L level, the transistor Tr12 turns off. Consequently, the current Ipr flows toward the filter 222 side from the constant current source I11 through the transistor Tr11.

Incidentally, as described above, the phase comparator 21 is outputting the signal dec of a pulse width according to the phase difference, and outputs the signal inc fixed to the L level. Therefore, the current Ipr=Idown2−Iup2=Idown2−0=Idown2 flows. That is, the current of Idown2 will flow in a direction going from the transistor Tr11 to the filter 222.

The filter 222 sends the current Iprop obtained by removing the high frequency component of the current Ipr. Here, the current Iprop flows toward the node X side from the filter 222 side.

In the integral path 23, since the signal inc is fixed to the L level, the transistor Tr21 turns off. On the other hand, the transistor Tr22 turns on in a duration when the signal dec is in the H level of a pulse width according to the phase difference. Consequently, the current Iint flows toward the constant current source I22 from the integrator 232 side through the transistor Tr22.

Incidentally, as described above, the phase comparator 21 is outputting the signal dec of a pulse width according to the phase difference, and is outputting the signal inc fixed to the L level. Therefore, the current Iint=Iup1−Idown1=0−Idown1=−Idown1 flows. That is, the current of Idown1 will flow in a direction going from the integrator 232 to the transistor Tr22.

In the integrator 232, electric charges of the current Iint are discharged from the capacitative element Cint. Then, a voltage (integrated result) vint proportional to the electric charges accumulated in the capacitative element Cint is outputted. Since the voltage vint becomes small, the comparatively small current Ivi flows toward the ground voltage terminal (node) GND from the node X in the VIC circuit 233.

Thus, since the current Iprop flows toward the node X from the proportional path 22 side and the comparatively small current Ivi flows toward the integral path 23 side from the node X, the current flowing between the source and the drain of the transistor P1A of the adder 24 becomes comparatively small. In connection with it, the drain current Iro of the transistor P2A also becomes comparatively small. Thereby, the frequency of the oscillating signal outputted from the oscillator 25 becomes small. In connection with it, the frequency of the output signal (feedback signal) FB of the frequency divider 26 also becomes small. As a result, the phase of the feedback signal FB that is advanced is delayed, and is adjusted so as to virtually coincide with the phase of the reference signal Ref.

As explained above, in the above, the explanation was given assuming that the signals dec, inc do not have the overlap time during which the two transistors Tr11, Tr12 of the charge pump 221 turn on (the same also holds for the charge pump 231) from a setting of the phase comparator 21. However, even if the phase comparator 21 outputs the signals dec, inc so that they may have the overlap time, phase difference information is given as widths of pulses of the signals dec, inc that turn on respective switching devices. That is, the difference currents Ipr, Iint are given to the filter 222 and the integrator 232 in the proportional path 22, respectively. Since these difference currents Ipr, Iint show the phase difference information surely, even if they have the overlap time, it is possible to make this circuit perform the same operation as described above.

(Modification of PLL Circuit 1)

Figure 12:
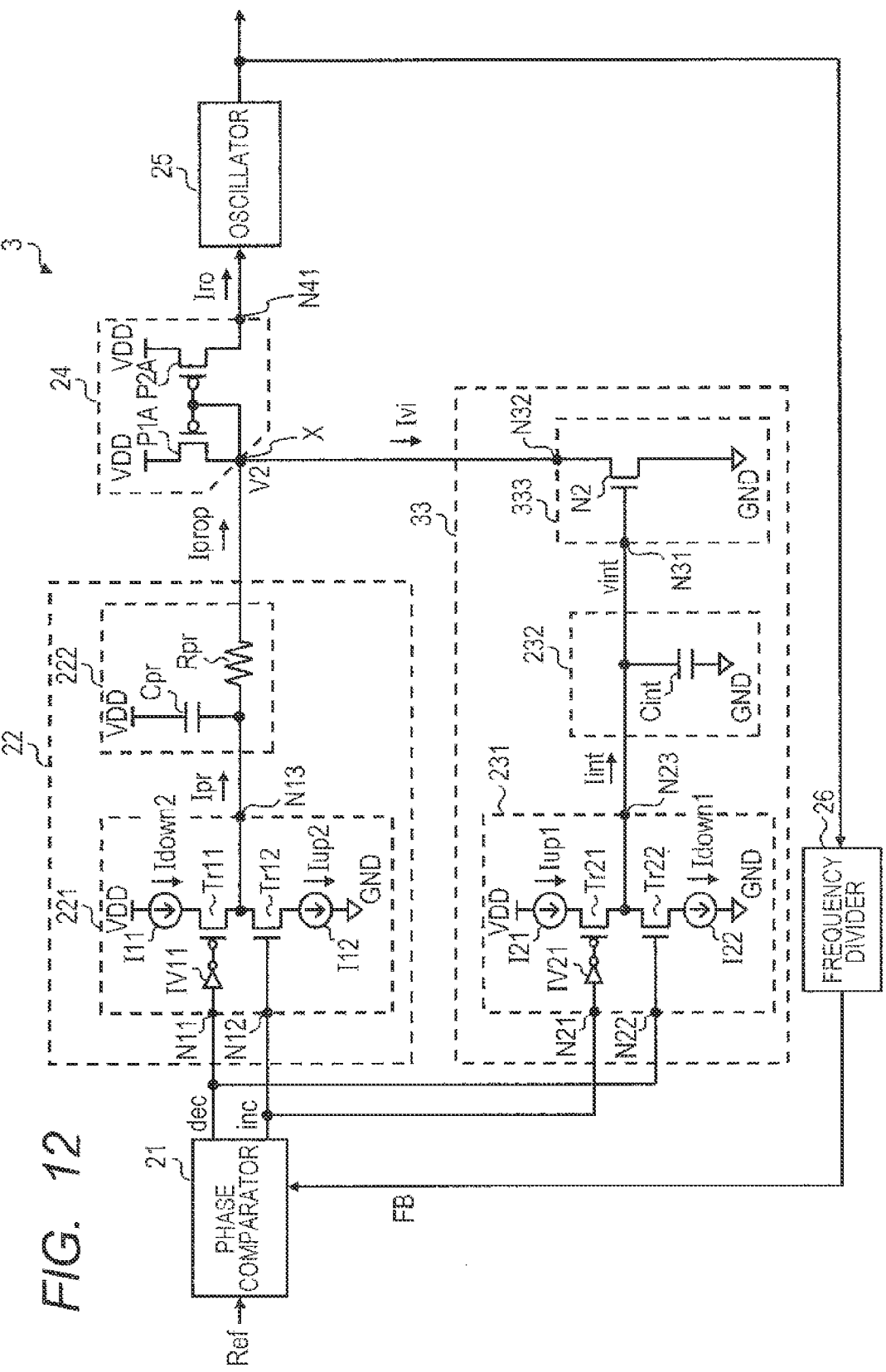
FIG. 12 is a diagram showing a modification of the PLL circuit according to the third embodiment of the present invention.

FIG. 12 is a diagram showing a modification of the PLL circuit 2 shown in FIG. 11 as a PLL circuit 3. The PLL circuit shown in FIG. 12 differs in a configuration of the VIC circuit provided over the integral path as compared with the PLL circuit 2 shown in FIG. 11. Although the circuit shown in FIG. 9A was specified as the VIC circuit 233 in FIG. 11, here, a circuit shown in FIG. 9B is specified as a VIC circuit 333. That is, the PLL circuit 3 shown in FIG. 12 adopts the following circuits: the circuit shown in FIG. 7A as the charge pump circuit 221; the circuit shown in FIG. 8A as the charge pump circuit 231; the circuit shown in FIG. 9B as the VIC circuit 333; and the circuit shown in FIG. 10A as the adder 24.

As compared with the integral path 23, an integral path 33 of the PLL circuit 3 shown in FIG. 12 has the VIC circuit 333 instead of the VIC circuit 233. The VIC circuit 333 has only the transistor N2, and does not have the resistance element Rvi. Since other circuit configurations of the PLL circuit 3 shown in FIG. 12 are the same as those of the case of the PLL circuit 2 shown in FIG. 11, their explanations are omitted.

In the PLL circuit 3 shown in FIG. 12, since the VIC circuit 333 does not have the resistance element Rvi, the circuit scale is curbed. On the other hand, in the PLL circuit 2 shown in FIG. 11, since the VIC circuit 233 has the resistance element Rvi, the circuit scale will increase by an amount related to this configuration. However, since in the PLL circuit 2 shown in FIG. 11, the transconductance gm of the VIC circuit 233 is determined by the transistor N1 and the resistance element Rvi, an influence of a transconductance of the transistor N1 that is easily changeable with temperature or by the device can be relaxed.

Fourth Embodiment

Figure 13:
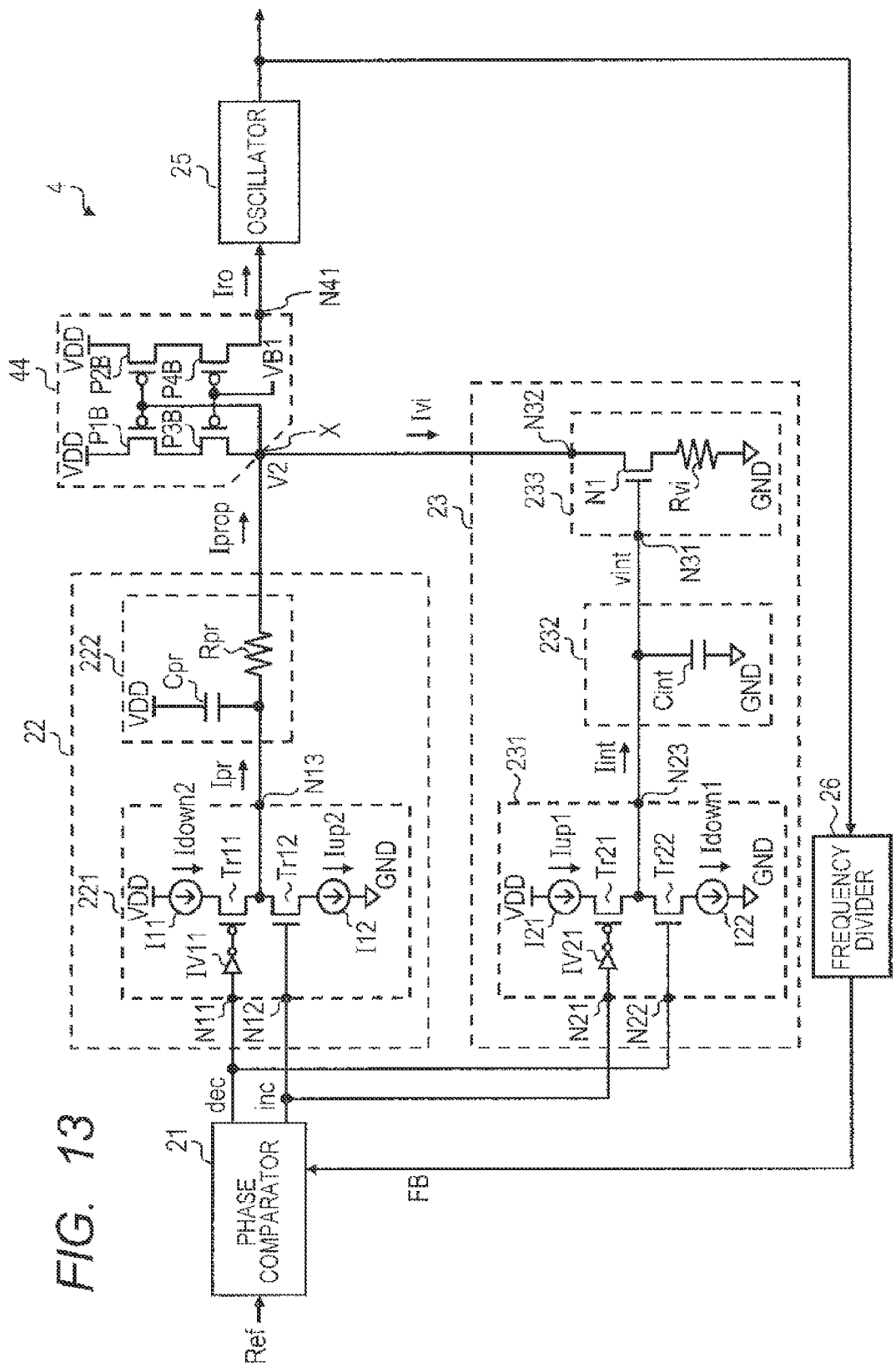
FIG. 13 is a diagram showing a configuration example of a PLL circuit according to a fourth embodiment of the present invention.

FIG. 13 is a diagram showing a configuration example of a PLL circuit 4 according to the fourth embodiment of the present invention. In the PLL circuit 4 shown in FIG. 13, a configuration of its adder is different as compared with that of the PLL circuit 2 shown in FIG. 11. Although the circuit shown in FIG. 10A was specified as the adder 24 in FIG. 11, here, the circuit shown in FIG. 10B is specified as an adder 44. That is, the PLL circuit 4 shown in FIG. 13 adopts the circuit shown in FIG. 7A as the charge pump circuit 221, the circuit shown in FIG. 8A as the charge pump circuit 231, the circuit shown in FIG. 9A as the VIC circuit 233, and the circuit shown in FIG. 10B as the adder 44. Below, it will be explained specifically.

The PLL circuit 4 shown in FIG. 13 has the adder 44 in place of the adder 24. The adder 44 is a current-based adder and has P-channel MOS transistors (hereinafter, called simply transistors) P1B to P4B. In the transistor P1B, its source is coupled to the power supply voltage terminal (node) VDD, its drain is coupled to the source of the transistor P3B, and its gate is coupled to the node X. In the transistor P2B, its source is coupled to the power supply voltage terminal (node) VDD, its drain is coupled to the source of the transistor P4B, and its gate is coupled to the node X. In the transistor P3B, its drain is coupled to the node X and its gate is coupled to the gate of the transistor P4B. In the transistor P4B, its drain is coupled to the output node N41 (input terminal of the oscillator 25 (node)). That is, the transistor P3B is cascode-coupled to the transistor P1B. The transistor P4B is cascode-coupled to the transistor P2B.

Moreover, the bias voltage VB1 is impressed to each gate of the transistors P3B, P4B. The bias voltage VB1 is generated, for example, by the bias voltage generating circuit as shown in FIG. 10D. The bias voltage generating circuit shown in FIG. 10D has one P-channel transistor P10D and the current source Ivb. In the transistor P10D, its source is coupled to the power supply voltage terminal (node) VDD, and its gate and drain are coupled to the current source Ivb. The current source Ivb is provided between the gate and the drain of the transistor P10D and the ground voltage terminal (node) GND. Then, the bias voltage generating part shown in FIG. 10D outputs a voltage of the drain of the transistor P10D as the bias voltage VB1. Incidentally, as long as the bias voltage VB1 of the desired potential is generable, a configuration of the bias voltage generating part may be any configuration, not being limited to the configuration shown in FIG. 10D.

Since other circuit configurations and operations of the PLL circuit 4 shown in FIG. 13 are the same as those of the case of the PLL circuit 2 shown in FIG. 11, their explanations are omitted.

In the PLL circuit 2 shown in FIG. 11, an amount of change of the current flowing between the source and the drain of the transistor P2A in response to a change of the power supply voltage VDD is large. On the other hand, in the PLL circuit 4 shown in FIG. 13, since the transistors P3B, P4B are further provided in it, the amount of change of the current flowing between the source and the drain of the transistor P2B in response to a change of the power supply voltage VDD is comparatively small. That is, the PLL circuit 4 shown in FIG. 13 can make small the amount of change of the current Iro in response to a change of the power supply voltage VDD.

Fifth Embodiment

Figure 14:
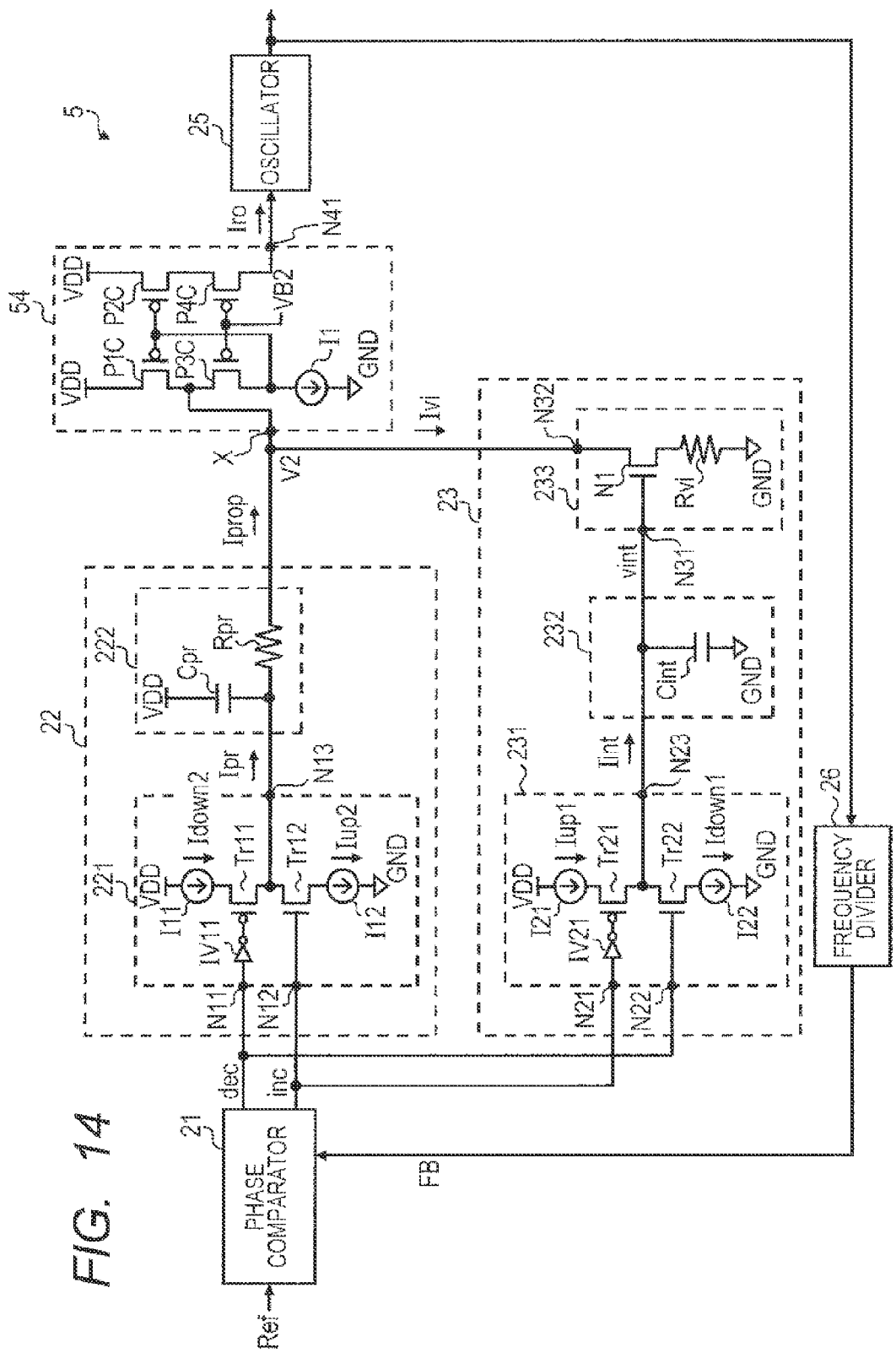
FIG. 14 is a diagram showing a configuration example of a PLL circuit according to a fifth embodiment of the present invention.

FIG. 14 is a diagram showing a configuration example of the PLL circuit 5 according to the fifth embodiment of the present invention. In the PLL circuit 5 shown in FIG. 14, a configuration of an adder is different as compared with that of the PLL circuit 2 shown in FIG. 11. Although the circuit shown in FIG. 10A was specified as the adder 24 in FIG. 11, here, the circuit shown in FIG. 10C is specified as the adder 54. That is, the PLL circuit 5 shown in FIG. 14 adopts the following circuits: the circuit shown in FIG. 7A as the charge pump circuit 221; the circuit shown in FIG. 8A as the charge pump circuit 231; the circuit shown in FIG. 9A as the VIC circuit 233; and the circuit shown in FIG. 10C as the adder 54. Below, it will be explained specifically.

The PLL circuit 5 shown in FIG. 14 has an adder 54 in place of the adder 24. The adder 54 is a current-based adder, and has the P-channel MOS transistors P1C to P4C and the constant current source I1 for sending a fixed current. In the transistor P1C, its source is coupled to the power supply voltage terminal (node) VDD, its drain is coupled to the node X, and its gate is coupled to the drain of the transistor P3C. In the transistor P2C, its source is coupled to the power supply voltage terminal (node) VDD, its drain is coupled to the source of the transistor P4C, and its gate is coupled to the drain of the transistor P3C. In the transistor P3C, its source is coupled to the node X and its gate is coupled to the gate of the transistor P4C. In the transistor P4C, its drain is coupled to the output node N41 (input terminal of the oscillator 25 (node)). The constant current source I1 is provided between the drain of the transistor P3C and the ground voltage terminal (node) GND.

Moreover, the bias voltage VB2 is impressed to each gate of the transistors P3C and P4C. The bias voltage VB2 is generated, for example, by the bias voltage generating circuit as shown in FIG. 10D. The bias voltage generating circuit shown in FIG. 10D has one P-channel transistor P10D and the current source Ivb. In the transistor P10D, its source is coupled to the power supply voltage terminal (node) VDD, and its gate and drain are coupled to the current source Ivb. The current source Ivb is provided between the gate and the drain of the transistor P10D and the ground voltage terminal (node) GND. Then, the bias voltage generating part shown in FIG. 10D outputs a voltage of the drain of the transistor P10D as the bias voltage VB2. Incidentally, as long as the bias voltage VB2 of a desired potential is generable, the configuration of the bias voltage generating part may be any configuration, being not limited to the configuration shown in FIG. 10D.

Since other circuit configurations and operations of the PLL circuit 5 shown in FIG. 14 are the same as those of the case of the PLL circuit 2 shown in FIG. 11, their explanations are omitted.

In the PLL circuit according to the present invention, when a frequency range of the oscillating signal is wide, a current range of the VIC circuit also becomes large according to it. Here, for example, in the PLL circuit 2 shown in FIG. 11, the VIC circuit 233 and a gate of the transistor P1A are directly coupled. For this reason, a gate voltage V2 of the transistor P1A needs to be settable so that a saturation range of the VIC circuit 233 can be secured. Therefore, the size of the transistor P1A is required to be large to some extent. Normally, since the smaller the gate width of the transistor P1A, the much the thermal noise is suppressed, there is a possibility that the PLL circuit 2 shown in FIG. 11 is unable to suppress the thermal noise sufficiently.

On the other hand, in the PLL circuit 5 shown in FIG. 14, the VIC circuit 233 and a gate of the transistor P1C are not directly coupled. Specifically, the VIC circuit 233 is coupled to a drain (node X) of the transistor P1C and the gate of the transistor P1C is coupled to the constant current source I1. In the PLL circuit 5 shown in FIG. 14, since a gate voltage of the transistor P1C can be set up regardless of a current range of the VIC circuit 233, it is possible to suppress the thermal noise sufficiently by making small a gate width of the transistor P1C.

Sixth Embodiment

Figure 15:
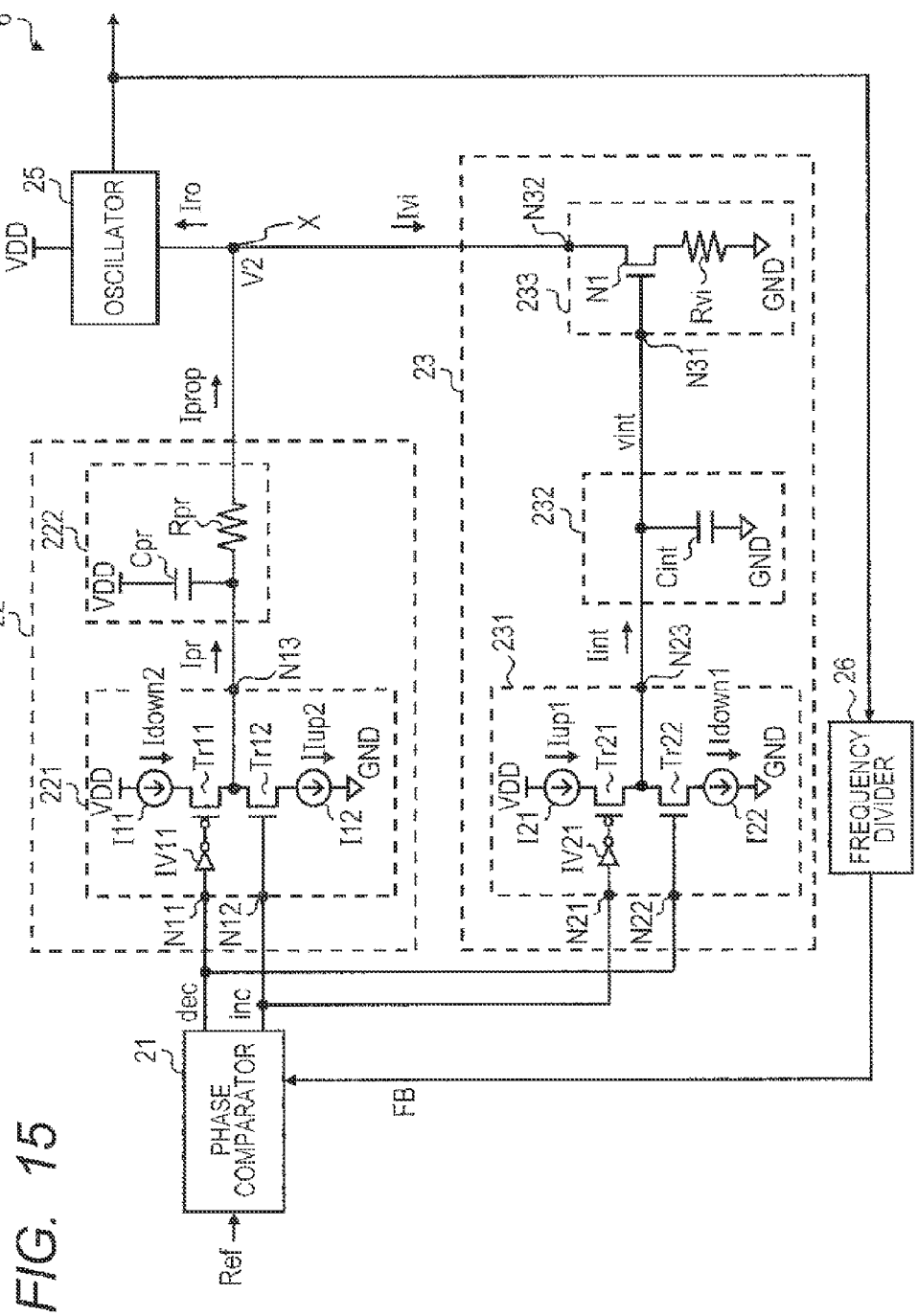
FIG. 15 is a diagram showing a configuration example of a PLL circuit according to a sixth embodiment of the present invention.
Figure 16:
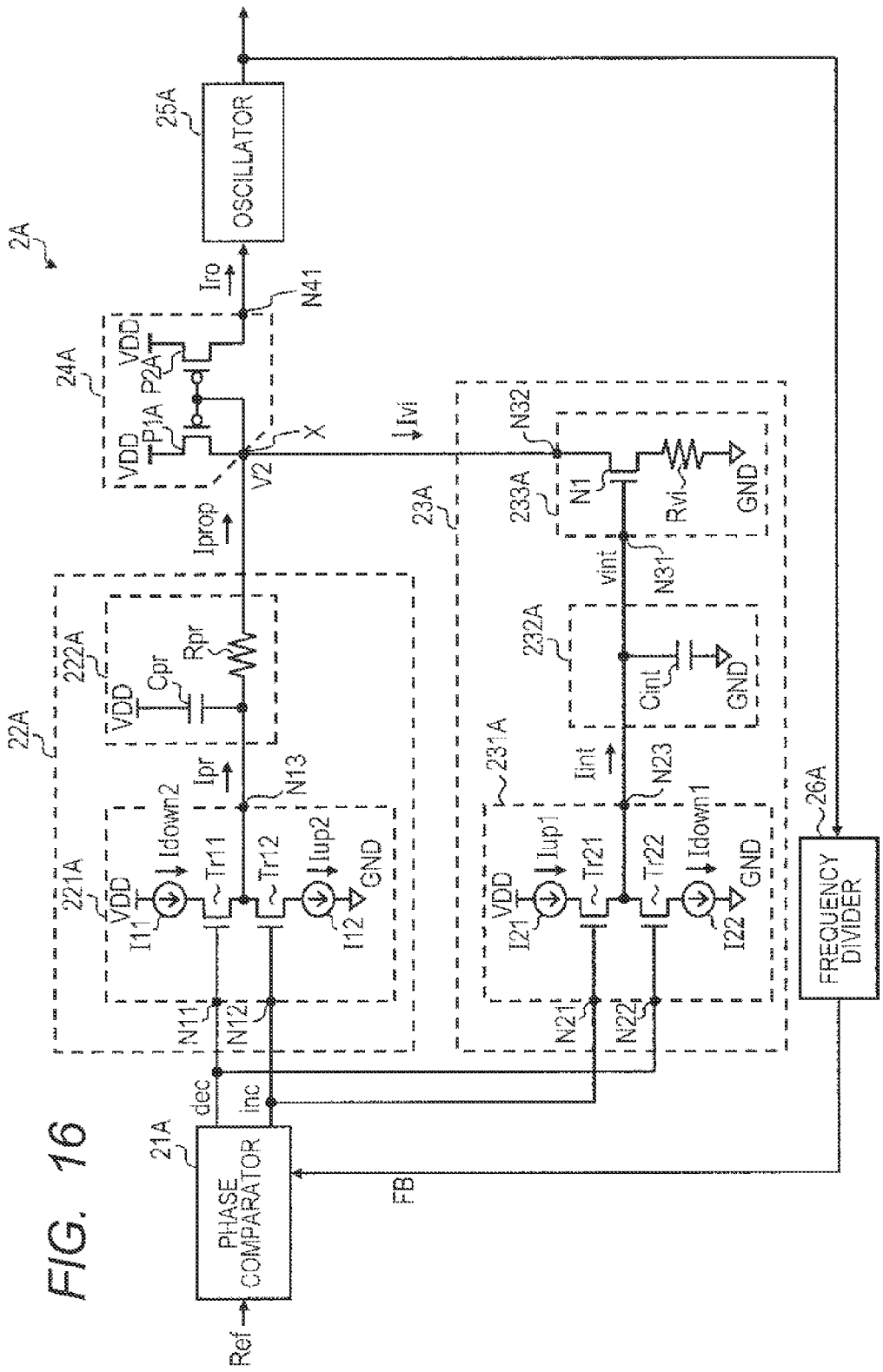
FIG. 16 is a diagram showing another configuration example of a PLL circuit according to the present invention.
Figure 17:
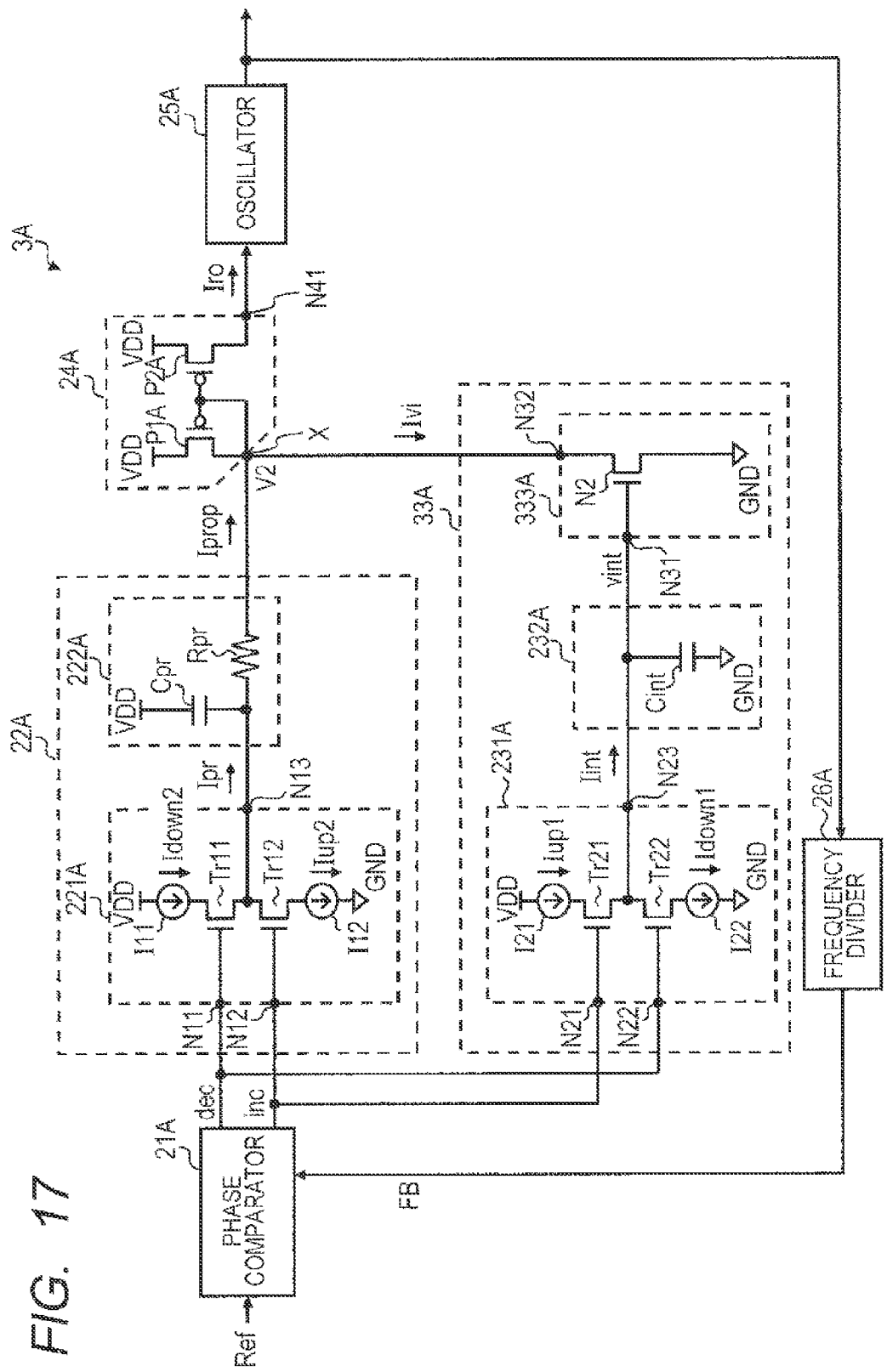
FIG. 17 is a diagram showing another configuration example of a PLL circuit according to the present invention.
Figure 18:
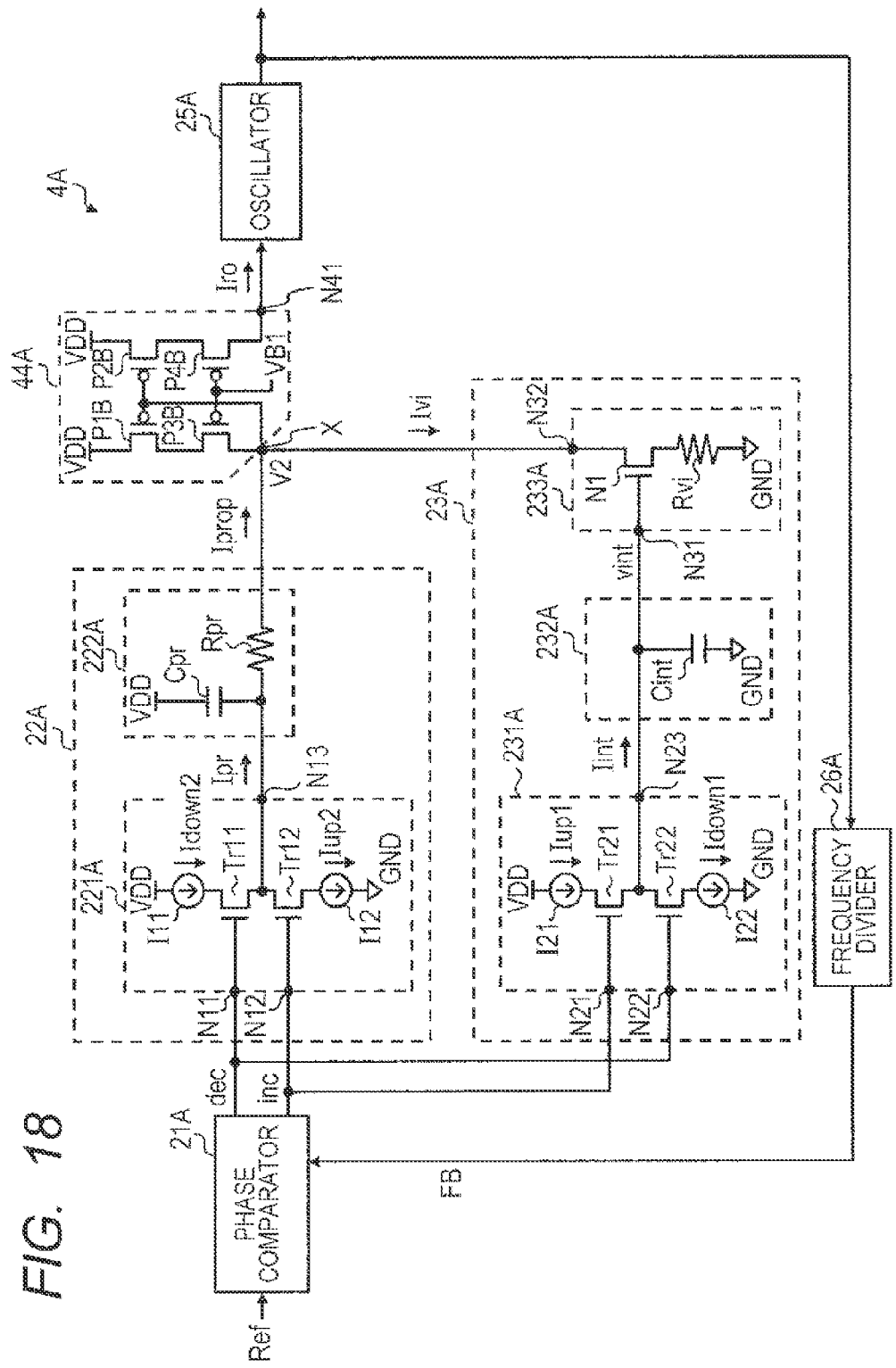
FIG. 18 is a diagram showing another configuration example of a PLL circuit according to the present invention.
Figure 19:
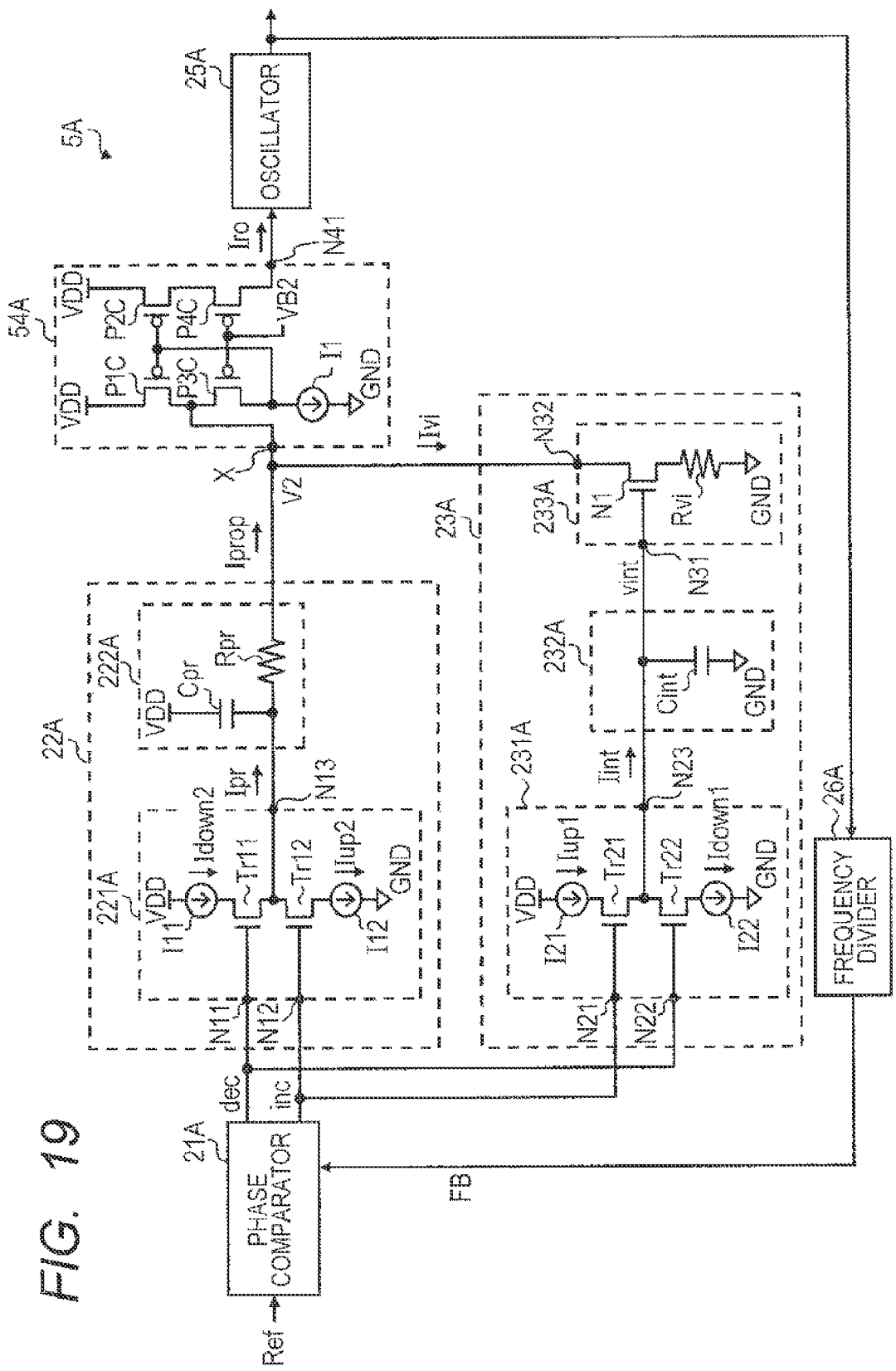
FIG. 19 is a diagram showing another configuration example of a PLL circuit according to the present invention.
Figure 20:
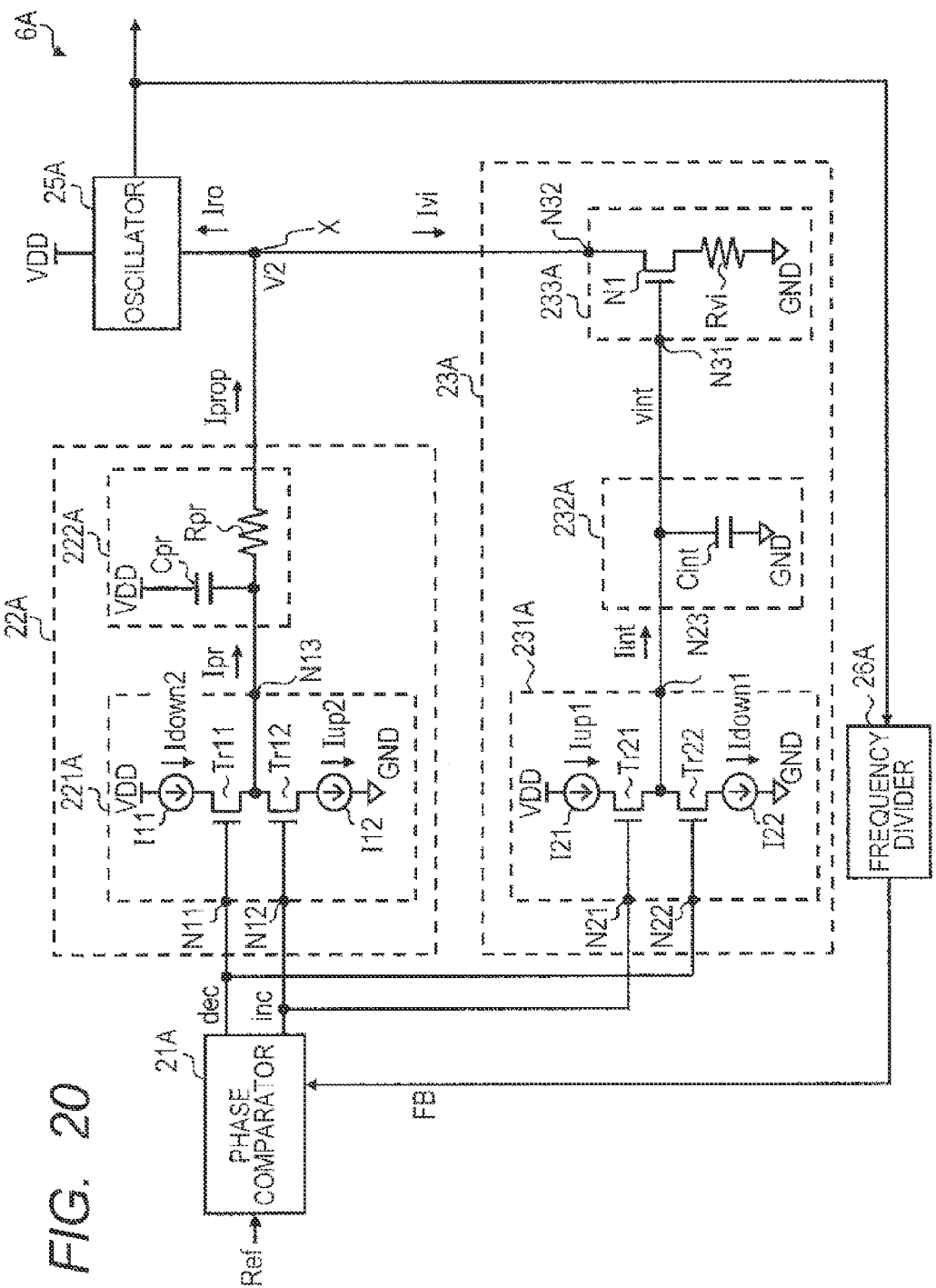
FIG. 20 is a diagram showing another configuration example of a PLL circuit according to the present invention.

FIG. 15 is a diagram showing a configuration example of the PLL circuit 6 according to the sixth embodiment of the present invention. In the PLL circuit 6 shown in FIG. 15, a configuration of an adder is different as compared with that of the PLL circuit 2 shown in FIG. 11. Specifically, in the PLL circuit 6 shown in FIG. 15, the adder is not formed with transistors etc. and supplies the current Iro added at the node X to the oscillator 25 as it is. Since other circuit configurations and operations of the PLL circuit 4 shown in FIG. 15 are the same as those of the case of the PLL circuit 2 shown in FIG. 11, their explanations are omitted.

Even with such a configuration, the same effect as that of the PLL circuits according to other embodiments described can be provided.

(Other Configuration Example of PLL Circuit According to the Present Invention)

FIG. 16 to FIG. 20 are diagrams showing other configuration examples of the PLL circuit according to the present invention as PLL circuits 2A to 6A, respectively. The configurations of the PLL circuits 2A to 6A shown in FIG. 16 to FIG. 20 are the configurations of the PLL circuits 2 to 6 shown in FIG. 11 to FIG. 15 each of which is modified so that the P-channel MOS transistors Tr11, Tr21 provided in the charge pump may be replaced with N-channel MOS transistors Tr11, Tr21 with a different polarity and the inverters IV11, IV21 may be deleted. Since other circuit configurations and operations of the PLL circuits 2A to 6A shown in FIG. 13 to FIG. 20 are the same as those of the PLL circuits 2 to 6 shown in FIG. 11 to FIG. 15, respectively, their explanations are omitted.

Incidentally, a phase comparator 21A corresponds to the phase comparator 21. A proportional path 22A corresponds to the proportional path 22. Integral paths 23A, 33A correspond to the integral path 23, respectively. Adders 24A, 44A, and 54A correspond to the adder 24, respectively. An oscillator 25A corresponds to the oscillator 25. A frequency divider 26A corresponds to the frequency divider 26. A charge pump 221A corresponds to the charge pump 221. A filter 222A corresponds to the filter 222. A charge pump 231A corresponds to the charge pump 231. An integrator 232A corresponds to the integrator 232. VIC circuits 233A, 333A correspond to the VIC circuit 233, respectively.

Also in the cases of the PLL circuits 2A to 6A shown in FIG. 16 to FIG. 20, the same effect as those of the above-mentioned embodiments can be provided.

(Layout Configuration Example of PLL Circuit According to the Present Invention)

Figure 21:
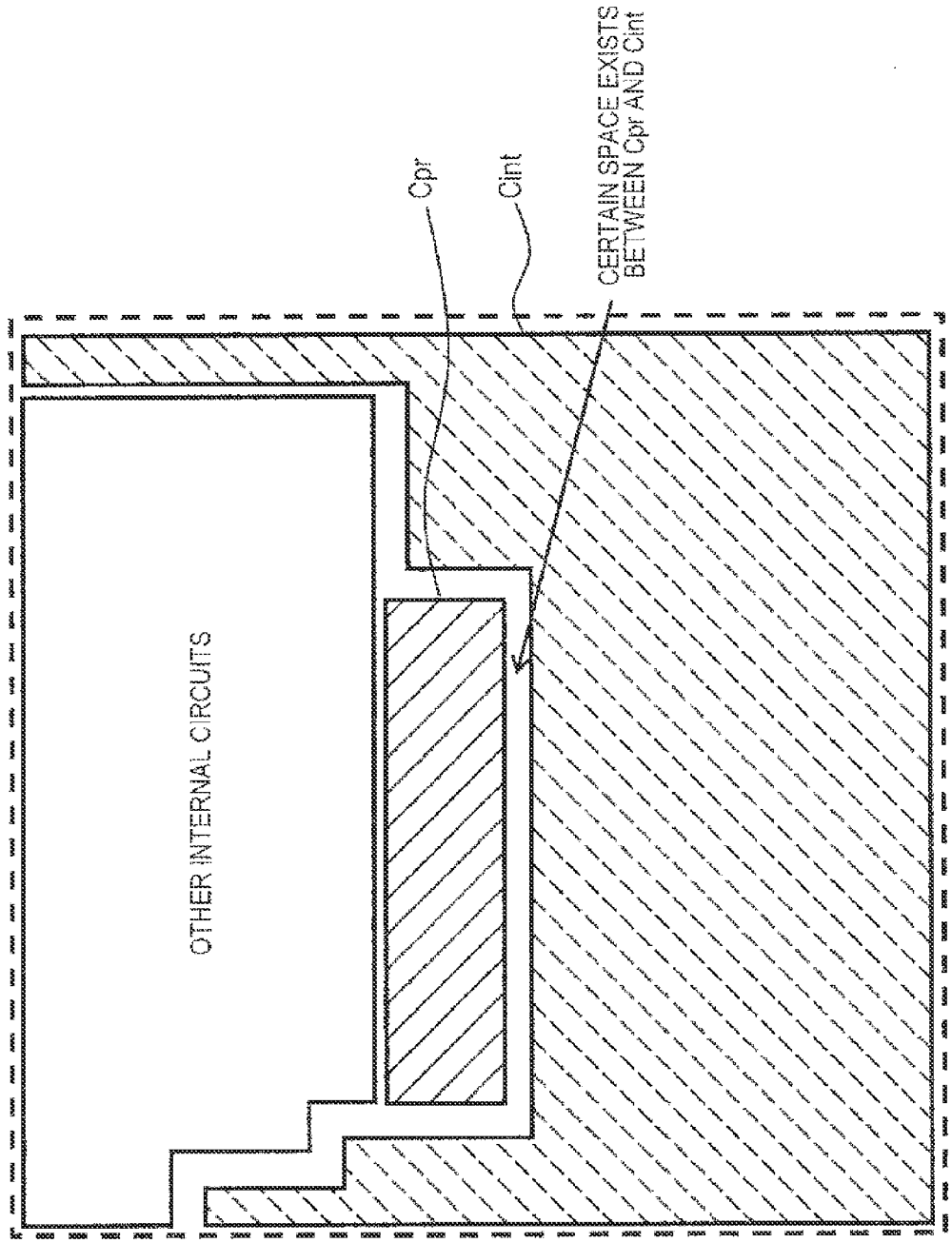
FIG. 21 is a diagram showing a configuration of a layout of a PLL circuit according to the present invention.

Next, a layout configuration of the PLL circuit according to the present invention will be explained, comparing it with the PLL circuit of the related art. FIG. 21 is a diagram showing a layout configuration example of the PLL circuit 1 according to the present invention shown in FIG. 1. Moreover, FIG. 22 is a diagram showing a layout configuration of the PLL circuit 500 of the related art shown in FIG. 23.

As shown in FIG. 21, over a chip of the PLL circuit 1 according to the present invention, there are placed the capacitative element Cint in the lower part of the page, the capacitative element Cpr in the center of the page, and other circuits forming the PLL circuit 1 in the upper part of the page. Here, as shown in FIG. 1, the capacitative element Cpr is coupled to the power supply voltage terminal (node) VDD; the capacitative element Cint is coupled to the ground voltage terminal (node) GND. That is, the capacitative elements Cpr, Cint are coupled to different voltage sources, respectively. In other words, the capacitative elements Cpr, Cint are placed over WELLs of mutually different polarities, respectively. Therefore, as a result of WELL separation etc., the capacitative element Cpr and the capacitative element Cint are placed so as to separate from each other by a predetermined space (gap), as is also clear from FIG. 21.

Figure 22:
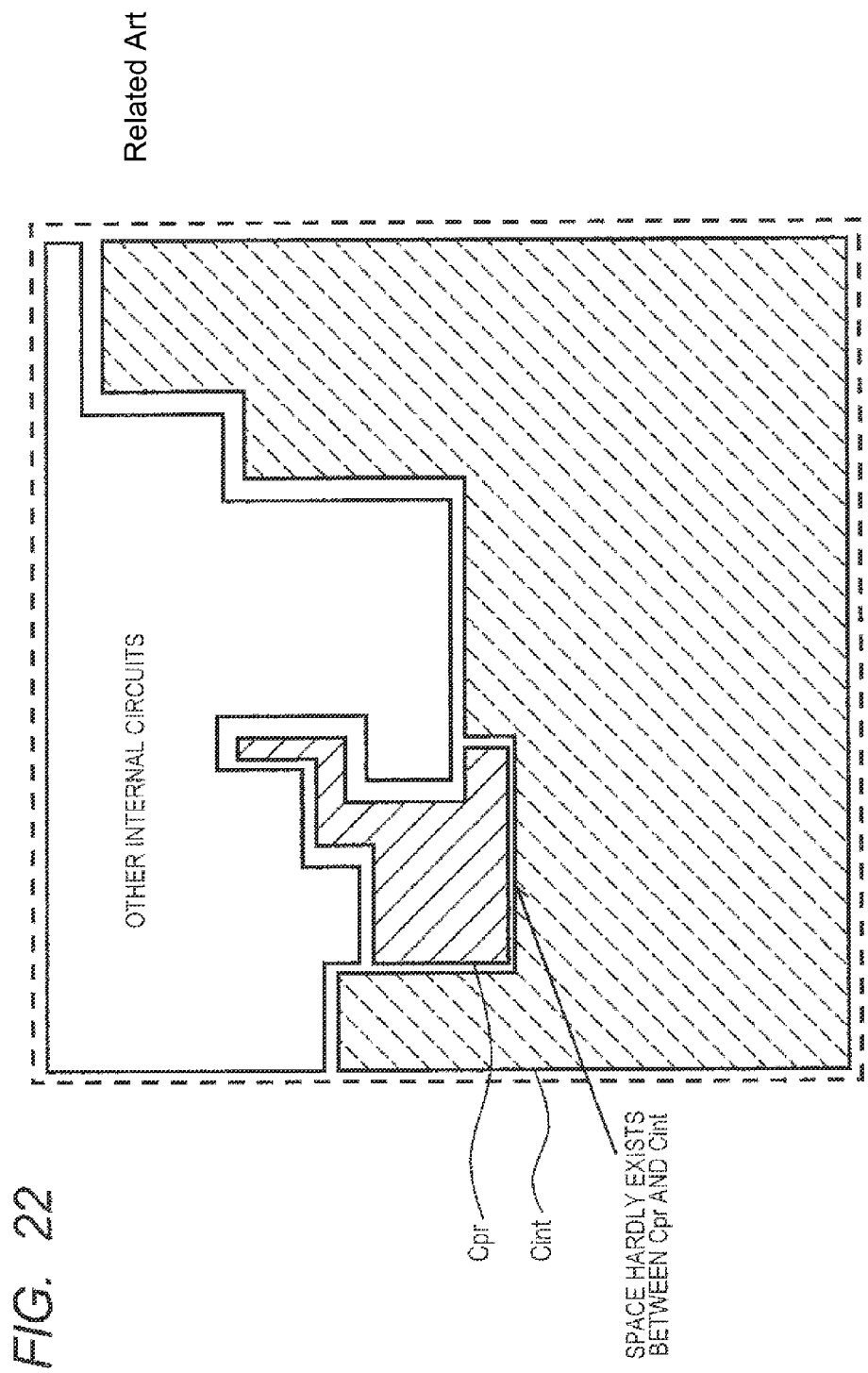
FIG. 22 is a diagram showing a configuration of a layout of a PLL circuit of a related art.

On the other hand, as shown in FIG. 22, over a chip of the PLL circuit 500 of the related art, there are placed the capacitative element Cint in the lower part of the page, the capacitative element Cpr in the center of the page, and other circuits forming the PLL circuit 500 in the upper part of the page. Here, as shown in FIG. 23, both of the capacitative elements Cpr, Cint are coupled to the ground voltage terminal (node) GND. That is, the capacitative elements Cpr, Cint are coupled to a common voltage source. Therefore, since the capacitative element Cpr and the capacitative element Cint have no necessity of WELL separation or the like, as is clear from FIG. 22, they are placed with hardly leaving a space therebetween as compared with the case of FIG. 21.

Thus, in the PLL circuit 1 according to the present invention, the capacitative element Cpr and the capacitative element Cint are placed with leaving a space (gap) wider than heretofore. Also in the PLL circuits according to the above-mentioned other embodiments, the same thing can be said.

Furthermore, in the PLL circuit 1 according to the present invention, since polarities of the capacitative element Cpr and the capacitative element Cint are different, they are placed over different devices, respectively, in many cases. Also in the PLL circuits according to the above-mentioned other embodiments, the same thing can be said.

Incidentally, it is desirable that the capacitative element Cpr provided in the proportional path be placed closer to the other internal circuits of the PLL circuit 1 than the capacitative element Cint provided in the integral path. This is because the proportional path side is required to respond more quickly than the integral path side.

(Comparison Between Present Application Invention and Related Art)

Figure 27:
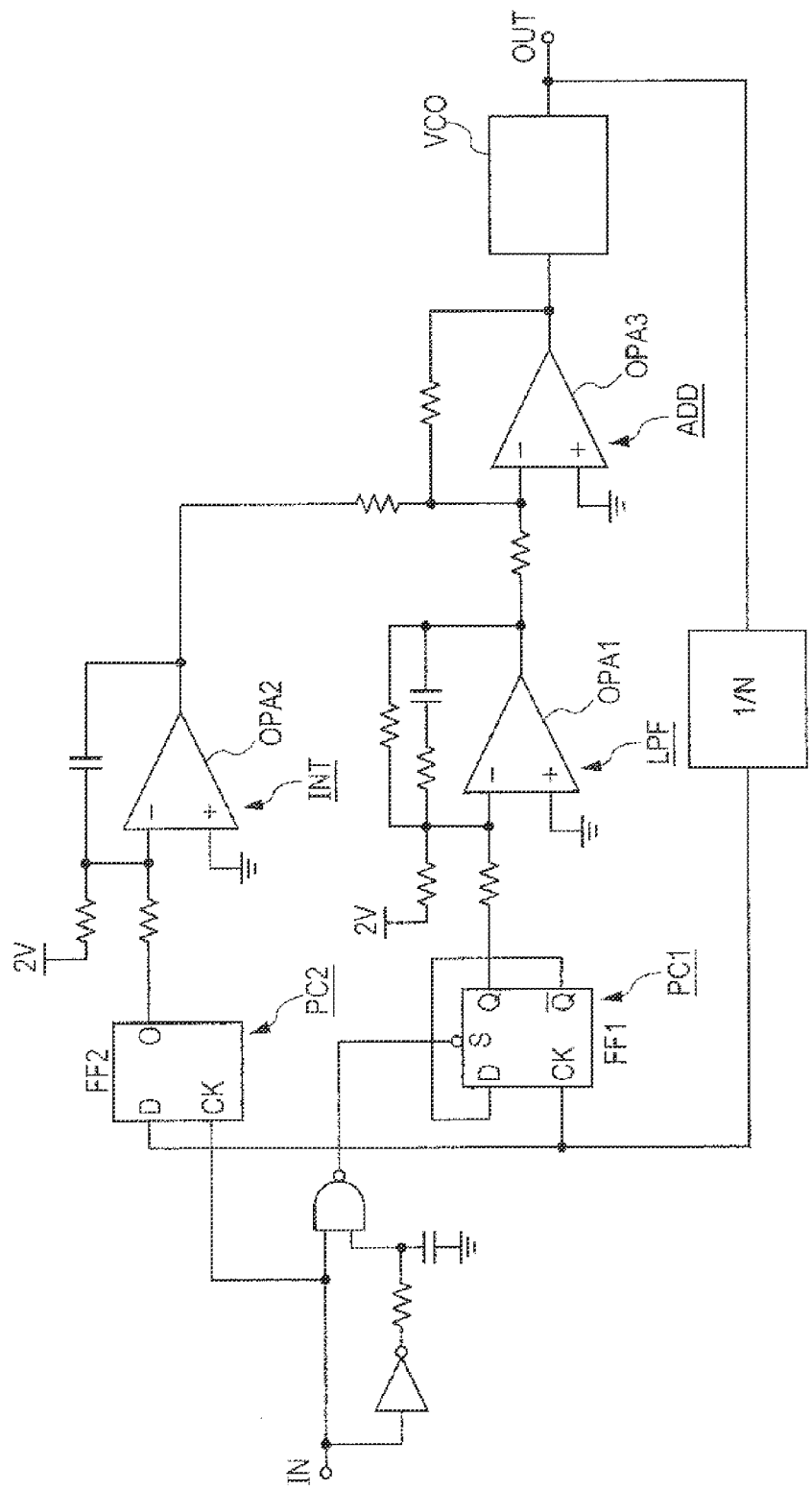
FIG. 27 is a diagram showing a configuration of a PLL circuit of the related art.
Figure 28:
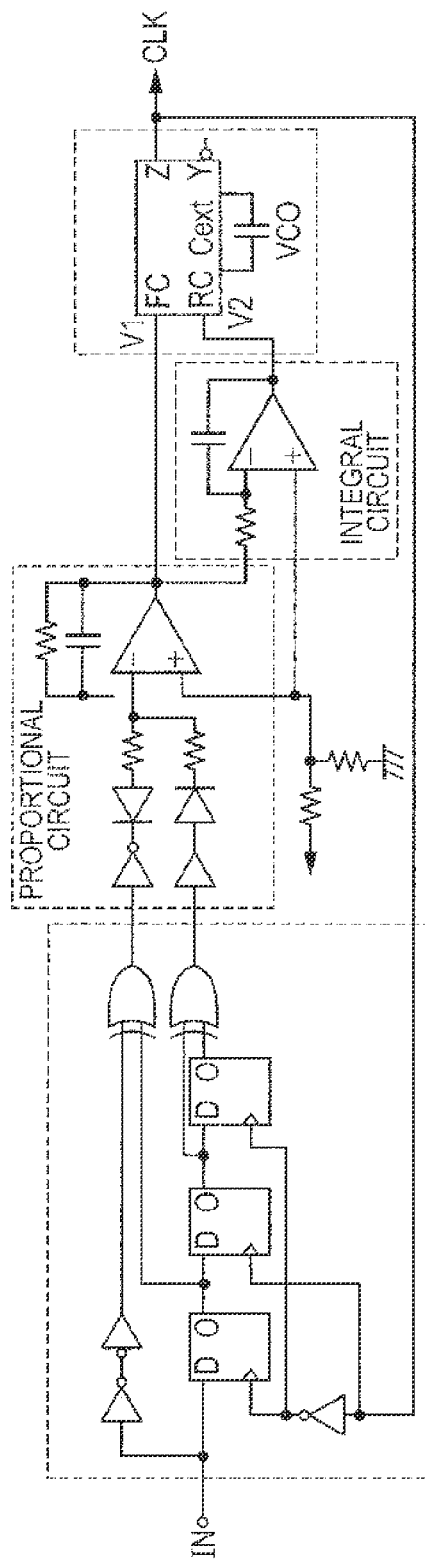
FIG. 28 is a diagram showing a configuration of a PLL circuit of the related art.

Next, a difference between the PLL circuit according to the present invention and PLL circuits of the related art disclosed by Japanese Unexamined Patent Publication No. S58 (1983)-107727 and by Japanese Unexamined Patent Publication No. Hei1(1989)-258510 will be explained. FIG. 27 is a diagram showing a configuration of the PLL circuit disclosed by Japanese Unexamined Patent Publication No. S58 (1983)-107727. FIG. 28 is a diagram showing a configuration of the PLL circuit disclosed by Japanese Unexamined Patent Publication No. Hei1 (1989)-258510.

First, in the case of the PLL circuit of the related art shown in FIG. 27, an adder ADD (operational amplifier OPA3) is generating a voltage obtained by adding an output voltage of a low-pass filter LPF (operational amplifier OPA1) and an output voltage of an integrator INT (operational amplifier OPA2). On the other hand, in the PLL circuit according to the present invention, the adder adds the output current Iprop of the filter and the current Ivi according to an output voltage of the integrator. That is, while the adder of the related art is a voltage addition type, the adder of the present invention is a current addition type.

Furthermore, in the case of the PLL circuit of the related art shown in FIG. 27, the low-pass filter LPF and the integrator INT have many resistance elements and capacitative elements in order to generate voltages. On the other hand, in the case of the PLL circuit according to the present invention, unlike the related art, the filter and the integrator only need to have at least one resistance element Rpr and two capacitative elements Cpr, Cint in total.

Furthermore, in the PLL circuit of the related art shown in FIG. 27, since the adder ADD, the low-pass filter LPF, and the integrator INT have respective operational amplifiers, there is a possibility that the output noise may become large as the whole PLL circuit. On the other hand, in the PLL circuit according to the present invention, since none of the adder, the filter, and the integrator has an operational amplifier, unlike the related art, the output noise does not become large as the whole PLL circuit.

Furthermore, in the case of the PLL circuit of the related art shown in FIG. 27, signals in the H level or in the L level from the phase comparators PC1, PC2 (flip-flops FF1, FF2) are supplied to the low-pass filter LPF and the integrator INT, respectively. On the other hand, in the case of the PLL circuit according to the present invention, the output currents Ipr, Iint from the current-based charge pumps are supplied to the filter and the integrator, respectively. That is, while the low-pass filter and the integrator of the related art are voltage control circuits, the filter and the adder of the present invention are current control circuits.

Furthermore, the PLL circuit of the related art shown in FIG. 27 has two phase comparators PC1, PC2. On the other hand, the PLL circuit according to the present invention has one phase comparator.

Next, in the case of the PLL circuit of the related art shown in FIG. 28, a voltage-controlled oscillator is outputting the oscillating signal of a frequency according to an output voltage of a proportional circuit and an output voltage of an integral circuit. On the other hand, in the case of the PLL circuit according to the present invention, the current control type oscillator is outputting the oscillating signal of a frequency according to a current Iro obtained by adding the output current Iprop of the filter and the current Ivi according to the output voltage of the integrator. That is, while the PLL circuit of the related art is a voltage control circuit, the PLL circuit according to the present invention is a current control circuit.

Furthermore, in the case of the PLL circuit of the related art shown in FIG. 28, the low-pass filter and the integrator have many resistance elements and capacitative elements in order to generate voltages. On the other hand, in the case of the PLL circuit according to the present invention, unlike the related art, the filter and the integrator only needs to have just at least one resistance element Rpr and two capacitative elements Cpr, Cint in total.

Furthermore, in the PLL circuit of the related art shown in FIG. 28, since the proportional circuit and the integral circuit has operational amplifiers, respectively, there is a possibility that the output noise may become large as the whole PLL circuit. On the other hand, in the PLL circuit according to the present invention, since neither the filter nor the integrator has an operational amplifier, unlike the related art, the output noise does not become large as the whole PLL circuit.

As described above, in the PLL circuit according to the above-mentioned first to fifth embodiments, the capacitative element Cint for integration and the resistance element Rpr forming the filter are provided over different paths. Therefore, the capacitance value of the capacitative element Cint and the resistance value of the resistance element Rpr are individually adjustable respectively, without being influenced mutually. Therefore, in the PLL circuit according to the above-mentioned embodiment, it is possible to make small the resistance value of the resistance element Rpr, without enlarging the capacitance value of the capacitative element Cint. Thereby, the PLL circuit according to the above-mentioned embodiment can suppress the output noise resulting from the resistance element Rpr, without increasing the circuit scale. As a result, the PLL circuit according to the above-mentioned embodiment can suppress the long term jitter within the range of the specification, without increasing the circuit scale.

Incidentally, the present invention is not limited to the above-mentioned embodiments and can be suitably changed within a range that does not deviate from the gist. For example, the explained configuration can be suitably modified into a configuration where conductivity types of all the transistors provided in the PLL circuit are replaced inversely and the voltages supplied to the power supply voltage terminal (node) and the ground voltage terminal (node) can be suitably changed to voltages of inverted polarities.

Moreover, although in the above-mentioned embodiment, the case where the current-based charge pump was formed with the N-channel MOS transistor was explained as an example, it is not limited to this but can be suitably changed into other circuit configurations that can realize the same operation.

Moreover, although in the above-mentioned embodiment, the case where the PLL circuit had the frequency divider was explained as an example, it is not limited to this and the frequency divider does not need to be included when there is no necessity of performing frequency division.

For example, a part of or all of the above-mentioned embodiments may be described like the following additional remarks, but they are not limited to the below.

(Additional Remark 1)

A PLL circuit that has: a phase comparator for detecting a phase difference between a reference signal and a feedback signal; first and second charge pumps each for outputting a current according to a detection result of the phase comparator; a filter for outputting a first current obtained by removing the high frequency component of the output current of the first charge pump; an integrator for integrating the output current of the second charge pump; a voltage-current conversion circuit for outputting a second current according to an integrated result; and an oscillator that generates an oscillating signal of a frequency according to a third current generated by adding the first and the second currents and feeds it back to the phase comparator.

(Additional Remark 2)

The PLL circuit according to additional remark 1, further having an adder for outputting the third current by adding the first and the second currents.

(Additional Remark 3)

Then PLL circuit according to additional remark 2, wherein the adder has a first transistor whose source is coupled to the first power supply, and whose drain and gate are commonly coupled to a first node to which the first and the second currents are supplied, and a second transistor whose source is coupled to the first power supply, whose gate is coupled to the first node, and whose drain is coupled to the oscillator.

(Additional Remark 4)

Then PLL circuit according to additional remark 4, wherein the adder further has a third transistor that is provided between a drain of the first transistor and the first node, and whose gate is supplied with a bias voltage, and a fourth transistor that is provided between a drain of the second transistor and the oscillator, and whose gate is supplied with the bias voltage.

(Additional Remark 5)

The PLL circuit according to additional remark 2, wherein the adder has: a constant current source for sending a fixed current; a first transistor whose source is coupled to a first power supply, whose drain is coupled to a first node to which the first and the second currents are supplied, and whose gate is coupled to the constant current source; a second transistor whose source is coupled to the first power supply, whose drain is coupled to the oscillator, and whose gate is coupled to the constant current source; a third transistor that is provided between the first node and the constant current source, and whose gate is supplied with a bias voltage; and a fourth transistor that is provided between a drain of the second transistor and the oscillator, and whose gate is supplied with the bias voltage.

(Additional Remark 6)

The PLL circuit according to additional remark 2, characterized in that the adder outputs a current of a first node to which the first and the second currents are supplied, as it is, as the third current.

(Additional Remark 7)

The PLL circuit according to any one of additional remarks 1 to 6, wherein the voltage-current conversion circuit has a fifth transistor whose gate is supplied with an integrated result of the integrator and that outputs a current flowing between its source and drain as the second current.

(Additional Remark 8)

The PLL circuit according to additional remark 7, wherein the voltage-current conversion circuit has a first resistance element that is coupled in series to the fifth transistor.

(Additional Remark 9)

The PLL circuit according to any one of the additional remarks 1 to 8, further having a frequency divider that frequency-divides an oscillating signal of the oscillator and outputs it as the feedback signal.

(Additional Remark 10)

The PLL circuit according to any one of the additional remarks 1 to 9, wherein the filter has a second resistance element provided in series on a first signal line in which an output current of the first charge pump flows, and a first capacitative element provided between the first signal line and a first power supply.

(Additional Remark 11)

The PLL circuit according to any one of additional remarks 1 to 10, wherein the integrator has a second capacitative element provided between a second signal line in which an output current of the second charge pump flows and a second power supply.

(Additional Remark 12)

The PLL circuit according to any one of additional remarks 1 to 9, wherein the filter has a second resistance element provided in series on a first signal line in which an output current of the first charge pump flows and a first capacitative element provided between the first signal line and the first power supply, and wherein the integrator has a second capacitative element provided between a second signal line in which an output current of the second charge pump flows and a second power supply.

(Additional Remark 13)

The PLL circuit according to additional remark 12, characterized in that the first capacitative element and the second capacitative element are placed on respective WELLs of different polarities.

(Additional Remark 14)

The PLL circuit according to either of additional remark 12 or 13, characterized in that the first capacitative element and the second capacitative element are placed with a predetermined space set therebetween.

(Additional Remark 15)

The PLL circuit according to additional remark 14, characterized in that the predetermined space is formed by a geometry that WELLs of different polarities are separated.

(Additional Remark 16)

The PLL circuit according to any one of additional remarks 12 to 15, characterized in that the first capacitative element is placed closer to other internal circuits than the second capacitative element.

(Additional Remark 17)

The PLL circuit according to any one of additional remarks 12 to 16, characterized in that the first capacitative element is placed between the second capacitative element and other internal circuits.

What is claimed is:

1. A PLL circuit, comprising:
a phase comparator to detect a phase difference between a reference signal and a feedback signal;
first and second charge pumps each to output a current according to a detection result of the phase comparator;
a filter to output a first current obtained by removing a high frequency component of the output current of the first charge pump;
an integrator to integrate the output current of the second charge pump;
a voltage-current conversion circuit to output a second current according to an integrated result of the integrator;
an oscillator to generate an oscillating signal of a frequency according to a third current generated by adding the first and the second currents, and to feed it back to the phase comparator, and
an adder that adds the first and the second currents to output the third current, wherein the adder includes:
a first transistor whose source is coupled to a first power supply, and whose drain and gate are coupled to a first node to which the first and the second currents are supplied;
a second transistor whose source is coupled to the first power supply, whose gate is coupled to the first node, and whose drain is coupled to the oscillator;
a third transistor that is provided between a drain of the first transistor and the first node, and whose gate is supplied with a bias voltage; and
a fourth transistor that is provided between a drain of the second transistor and the oscillator, and whose gate is supplied with the bias voltage.

2. A PLL circuit, comprising:
a phase comparator to detect a phase difference between a reference signal and a feedback signal;
first and second charge pumps each to output a current according to a detection result of the phase comparator;
a filter to output a first current obtained by removing a high frequency component of the output current of the first charge pump;
an integrator to integrate the output current of the second charge pump;
a voltage-current conversion circuit to output a second current according to an integrated result of the integrator;
an oscillator to generate an oscillating signal of a frequency according to a third current generated by adding the first and the second currents, and to feed it back to the phase comparator, and
an adder that adds the first and the second currents to output the third current, wherein the adder includes:
a constant current source to send a fixed current;
a first transistor whose source is coupled to a first power supply, whose drain is coupled to a first node to which the first and the second currents are supplied, and whose gate is coupled to the constant current source;
a second transistor whose source is coupled to the first power supply, whose drain is coupled to the oscillator, and whose gate is coupled to the constant current source;
a third transistor that is provided between the first node and the constant current source, and whose gate is supplied with a bias voltage; and
a fourth transistor that is provided between a drain of the second transistor and the oscillator, and whose gate is supplied with the bias voltage.

3. The PLL circuit according to claim 1, wherein the adder outputs a current of a first node to which the first and the second currents are supplied, as it is, as the third current.

4. The PLL circuit according to claim 1, wherein the voltage-current conversion circuit includes a fifth transistor whose gate is supplied with an integrated result of the integrator, and that outputs a current flowing between its source and drain as the second current.

5. The PLL circuit according to claim 4, wherein the voltage-current conversion circuit includes a first resistance element that is coupled in series to the fifth transistor.

6. The PLL circuit according to claim 1, further comprising:
a frequency divider to frequency-divide the oscillating signal of the oscillator and to output it as the feedback signal.

7. The PLL circuit according to claim 1, wherein the filter includes a second resistance element provided in series on a first signal line in which the output current of the first charge pump flows and a first capacitative element provided between the first signal line and the first power supply.

8. The PLL circuit according to claim 1, wherein the integrator includes a second capacitative element provided between a second signal line in which the output current of the second charge pump flows and a second power supply.

9. A PLL circuit, comprising:
a phase comparator to detect a phase difference between a reference signal and a feedback signal;
first and second charge pumps each to output a current according to a detection result of the phase comparator;
a filter to output a first current obtained by removing a high frequency component of the output current of the first charge pump;
an integrator to integrate the output current of the second charge pump;
a voltage-current conversion circuit to output a second current according to an integrated result of the integrator; and
an oscillator to generate an oscillating signal of a frequency according to a third current generated by adding the first and the second currents, and to feed it back to the phase comparator,
wherein the filter includes a second resistance element provided in series on a first signal line in which the output current of the first charge pump flows and a first capacitative element provided between the first signal line and the first power supply,
wherein the integrator includes a second capacitative element provided between a second signal line in which the output current of the second charge pump flows and a second power supply, and
wherein a voltage level of the first power supply is higher than a voltage level of the second power supply.

* * * * *

UNITED STATES PATENT AND TRADEMARK OFFICE
CERTIFICATE OF CORRECTION

PATENT NO. : 8,810,292 B2  Page 1 of 1
APPLICATION NO. : 13/711821
DATED : August 19, 2014
INVENTOR(S) : Akio Katsushima It is certified that error appears in the above-identified patent and that said Letters Patent is hereby corrected as shown below:

In the Specification

Column 24, Line 6: Before "side" insert -- 23 --.

Column 24, Line 6: Before "shown" insert -- 3 --.

Signed and Sealed this
Third Day of March, 2015

Michelle K. Lee
*Deputy Director of the United States Patent and Trademark Office*